United States Patent [19]

Hollier

[11] Patent Number: 5,794,188
[45] Date of Patent: Aug. 11, 1998

[54] SPEECH SIGNAL DISTORTION MEASUREMENT WHICH VARIES AS A FUNCTION OF THE DISTRIBUTION OF MEASURED DISTORTION OVER TIME AND FREQUENCY

[75] Inventor: Michael Peter Hollier, Suffolk, United Kingdom

[73] Assignee: British Telecommunications public limited company, London, Great Britain

[21] Appl. No.: 624,489

[22] PCT Filed: Nov. 22, 1994

[86] PCT No.: PCT/GB94/02562

§ 371 Date: Apr. 4, 1996

§ 102(e) Date: Apr. 4, 1996

[87] PCT Pub. No.: WO95/15035

PCT Pub. Date: Jun. 1, 1995

[30] Foreign Application Priority Data

Nov. 25, 1993 [GB] United Kingdom ............ 9324256
Jan. 6, 1994 [EP] European Pat. Off. ......... 94300073

[51] Int. Cl.$^6$ ............................................. H04B 3/46
[52] U.S. Cl. ............................... 704/228; 704/233
[58] Field of Search ........................ 395/2.37, 2.42; 704/228, 233

[56] References Cited

U.S. PATENT DOCUMENTS 4,860,360  8/1989  Boggs ................................. 704/233
4,972,484  11/1990 Theile et al. ....................... 704/227

FOREIGN PATENT DOCUMENTS

A 30 32 699  4/1982  Germany ............... G10L 1/06
2218299  11/1989 United Kingdom ....... H04R 1/28
2218300  11/1989 United Kingdom ....... H04R 29/00
WO 94/00922  1/1994  WIPO ...................... H04B 3/46

OTHER PUBLICATIONS

Quincy, "Prolog–Based Expert Pattern Recognition System Shell for Technology Independent, User–Oriented Classification of Voice Transmission Quality", IEEE Int Conf on Communications –Sessions 33.3, vol. 2, 7–10 Jun. 1987, Seattle (US), pp. 1164–1171.

Kubichek et al, "Speech Quality Assesment Using Expert Pattern Recognition Techniques", IEEE Pacific RIM Conference on Communications, Computers and Signal Processing, 1–2 Jun. 1989, Victoria (CA), pp. 208–211, XP000077468.

Patent Abstracts of Japan, vol. 17, No. 202 (E–1353), 20 Apr. 1993 & JP–A–04 345327 (Nippon Telegr7teleph Corp), 1 Dec. 1992.

Gierlich, "New Measurement Methods for Determining The Transfer Characteristics of Telephone Terminal Equipment", Proceedings of 1992 IEEE International Symposium on Circuits and Systems, 10–13 May 1992, San Diego (US), New York (US), vol. 4, pp. 2069–2072.

(List continued on next page.)

Primary Examiner—Reihard J. Eisenzopf
Assistant Examiner—Tãlivaldis Ivars Šmits
Attorney, Agent, or Firm—Nixon & Vanderhye P.C.

[57] ABSTRACT

Telecommunications testing apparatus includes an analyzer arranged to receive a distorted signal which corresponds to a test signal when distorted by telecommunications aparatus to be tested. The analyzer periodically derives, from the distorted signal, a plurality of spectral component signals responsive to the distortion in each of a plurality of spectral bands, over a succession of time intervals. The analyzer generates a measure of the subjective impact of the distortion due to the telecommunications apparatus, the measure of subjective impact being calculated to depend upon the spread of the distortion over time and/or over the spectral bands.

50 Claims, 13 Drawing Sheets

OTHER PUBLICATIONS

Sobolev, "Estimation of Speech Signal Transmission Quality from Measurements of Its Spectral Dynamics", Telecommunications and Radio Engineering, vol. 47 No. 1, Jan. 1992, Washington US, pp. 16–21, XP000316414.

Beerends, "A Perceptual Audio Quality Measure Based on a Psychoacoustic Sound Representation", J. Audio Eng. Soc., vol. 40, No. 12, 1992, pp. 963–978.

Brandenburg et al, "'NMR' and 'MAsking Flag': Evaluation of Quality Using Perceptual Criteria", AES 11th International Conference, pp. 169–179, 1992.

Zwicker et al, "Audio Engineering and Psychoacoustics: Matching Signals to the Final Receiver, the Human Auditory Sytem", J. Audio Eng. Soc., vol. 39, No. 3, 1991, pp. 115–126.

Irii et al, "Objective Measurement Method for Estimating Speech Quality of Low–Bit–Rate Speech Coding", NTT Review, vol. 3, No. 5, Sep. 1991, pp. 79–87.

Dimolitsas, et al. "Objective Speech Distortion Measures and Their Relevance to Speech Quality Assessments", IEE Proceedings, vol. 136, Pt. I, No. 5, Oct. 1989, pp. 317–324.

Herre et al, "Analysis Tool for Realtime Measurements Using Perceptual Criteria", AES 11th International Conference, 1992.

Kalittsev, "Estimated of the Information Content of Speech Signals", 1298 Telecommunications and Radio Engineering 47 (1992), Jan., No. 1, New York, US, pp. 11–15.

Beerends et al, "Measuring the Quality of Audio Devices", AES 90th Convention, (19 Feb. 1991), pp. 1–8.

Moore et al, "Suggested Formulae For Calculating Auditory–Filter Bandwidths and Excitation Patterns", J. Acoust. Soc. Am. 74(3), Sep. 1983, pp. 750–753.

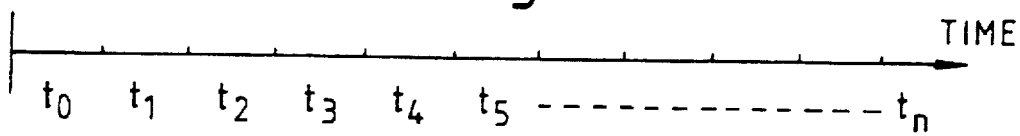
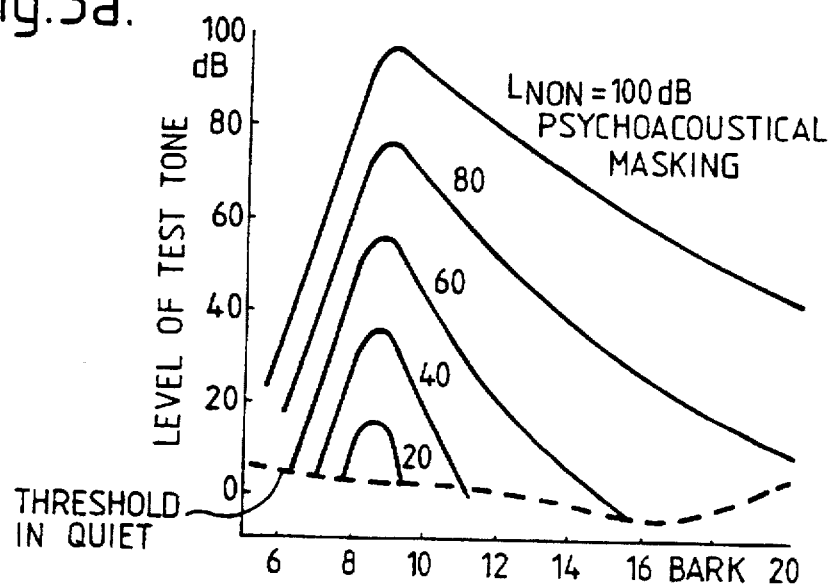
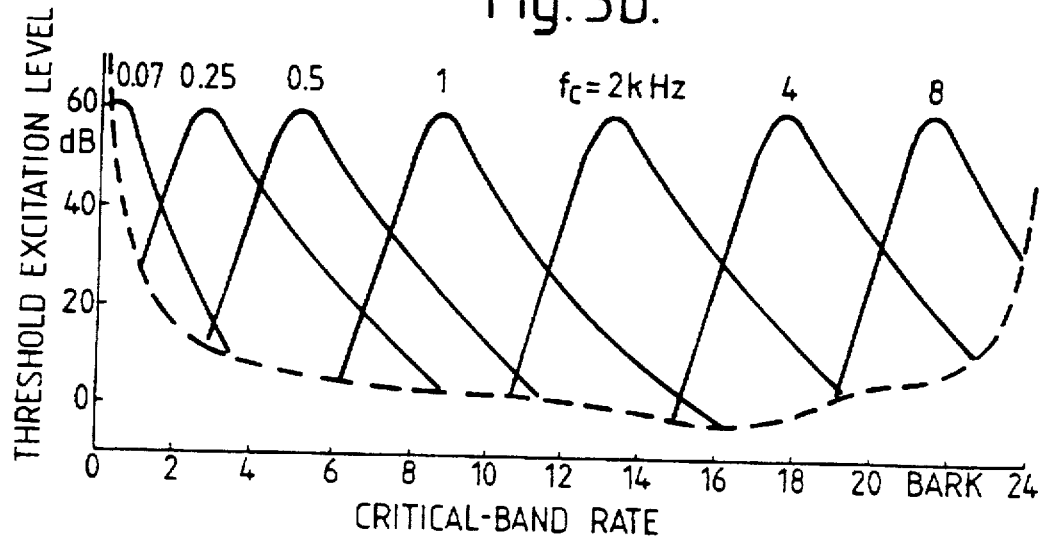

| 2 | 2 | 2 | 2 | 2 | 2 | 2 | 2 | 2 | 2 |
|---|---|---|---|---|---|---|---|---|---|
| 2 | 2 | 2 | 2 | 2 | 2 | 2 | 2 | 2 | 2 |
| 2 | 2 | 2 | 2 | 2 | 2 | 2 | 2 | 2 | 2 |
| 2 | 2 | 2 | 2 | 2 | 2 | 2 | 2 | 2 | 2 |
| 2 | 2 | 2 | 2 | 2 | 2 | 2 | 2 | 2 | 2 |
| 2 | 2 | 2 | 2 | 2 | 2 | 2 | 2 | 2 | 2 |
| 2 | 2 | 2 | 2 | 2 | 2 | 2 | 2 | 2 | 2 |
| 2 | 2 | 2 | 2 | 2 | 2 | 2 | 2 | 2 | 2 |
| 2 | 2 | 2 | 2 | 2 | 2 | 2 | 2 | 2 | 2 |
| 2 | 2 | 2 | 2 | 2 | 2 | 2 | 2 | 2 | 2 |
|   |   |   |   |   |   |   |   |   |   |
| ERROR-ACTIVITY= 200 ||| | ERROR-ENTROPY=4.605 ||| |

| 0.1 | 0.1 | 0.1 | 0.1 | 0.1 | 0.1 | 0.1 | 0.1 | 0.1 | 0.1 |
|---|---|---|---|---|---|---|---|---|---|
| 0.1 | 5 | 5 | 5 | 5 | 5 | 0.1 | 0.1 | 0.1 | 0.1 |
| 0.1 | 5 | 11 | 11 | 11 | 5 | 0.1 | 0.1 | 0.1 | 0.1 |
| 0.1 | 5 | 11 | 24.5 | 11 | 5 | 0.1 | 0.1 | 0.1 | 0.1 |
| 0.1 | 5 | 11 | 11 | 11 | 5 | 0.1 | 0.1 | 0.1 | 0.1 |
| 0.1 | 5 | 5 | 5 | 5 | 5 | 0.1 | 0.1 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |

ERROR-ACTIVITY= 200     ERROR-ENTROPY=3.294

Fig.12b.

| 0.1 | 0.1 | 0.1 | 0.1 | 0.1 | 0.1 | 0.1 | 0.1 | 0.1 | 0.1 |
|---|---|---|---|---|---|---|---|---|---|
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 190 | 0.1 | 0.1 |
| 0.1 | 0.1 | 0.1 | 0.1 | 0.1 | 0.1 | 0.1 | 0.1 | 0.1 | 0.1 |
| 0.1 | 0.1 | 0.1 | 0.1 | 0.1 | 0.1 | 0.1 | 0.1 | 0.1 | 0.1 |

ERROR-ACTIVITY = 200   ERROR-ENTROPY = 0.425

Fig.12c.

| 1 | 1 | 1 | 1 | 1 | 1 | 1 | 1 | 1 | 1 |
|---|---|---|---|---|---|---|---|---|---|
| 1 | 1 | 1 | 1 | 1 | 1 | 1 | 1 | 1 | 1 |
| 1 | 1 | 1 | 1 | 1 | 1 | 1 | 1 | 1 | 1 |
| 1 | 1 | 1 | 1 | 1 | 1 | 1 | 1 | 1 | 1 |
| 1 | 1 | 1 | 1 | 1 | 1 | 1 | 1 | 1 | 1 |
| 1 | 1 | 1 | 1 | 1 | 1 | 1 | 1 | 1 | 1 |
| 1 | 1 | 1 | 1 | 1 | 1 | 1 | 1 | 1 | 1 |
| 1 | 1 | 1 | 1 | 1 | 1 | 1 | 1901 | 1 | 1 |
| 1 | 1 | 1 | 1 | 1 | 1 | 1 | 1 | 1 | 1 |
| 1 | 1 | 1 | 1 | 1 | 1 | 1 | 1 | 1 | 1 |

ERROR-ACTIVITY = 2000   ERROR-ENTROPY = 0.425

SPEECH SIGNAL DISTORTION MEASUREMENT WHICH VARIES AS A FUNCTION OF THE DISTRIBUTION OF MEASURED DISTORTION OVER TIME AND FREQUENCY

BACKGROUND OF THE INVENTION

1. Field of the Invention

This invention relates to a method and apparatus for testing telecommunications apparatus.

2. Related Art

In testing telecommunications apparatus (for example, a telephone line, a telephone network, or communications apparatus such as a codec) a test signal is introduced to the input of the telecommunications apparatus, and some test is applied to the resulting output of the apparatus. It is known to derive "objective" test measurements, such as the signal to noise ratio, which can be calculated by automatic processing apparatus. It is also known to apply "subjective" tests, in which a human listener listens to the output of the telecommunications apparatus, and gives an opinion as to the quality of the output.

Some elements of telecommunications systems are linear. Accordingly, it is possible to apply simple artificial test signals, such as discrete frequency sine waves, swept sine signals or chirp signals, random or pseudo random noise signals, or impulses. The output signal can then be analyzed using, for example, Fast Fourier Transform (FFT) or some other spectral analysis technique. One or more such simple test signals are sufficient to characterise the behaviour of a linear system.

On the other hand, modern telecommunications systems include an increasing number of elements which are non-linear and/or time variant. For example, modern low bit-rate digital speech codecs, forming part of mobile telephone systems, have a nonlinear response and automatic gain controls (AGCs), voice activity detectors (VADs) and associated voice switches, and burst errors contribute time variations to telecommunications systems of which they form part.

Accordingly, it is increasingly less possible to use simple test methods developed for linear systems to derive objective measure of the distortion or acceptability of telecommunications apparatus.

The low correlation between objective measures of system performance or distortion and the subjective response of a human user of the system means that such subjective testing remains the best way of testing telecommunications apparatus. However, subjective testing by using human listeners is expensive, time-consuming, difficult to perform, and inconsistent.

Recently in the paper "Measuring the Quality of Audio Devices" by John G. Beerends and Jan A. Stemerdink, presented at the 90th AES Convention, 1991 Feb. 19–22, Paris, printed in AES Preprints as Preprint 3070 (L-8) by the Audio Engineering Society, it has been proposed to measure the quality of a speech codec for digital mobile radio by using, as test signals; a database of real recorded speech and analyzing the corresponding output of the codec using a perceptual analysis method designed to correspond in some aspects to the processes which are thought to occur in the human ear.

It has also been proposed (for example in "Objective Measurement Method for Estimating Speech Quality of Low Bit Rate Speech Coding", Irii, Kurashima, Kitawaki and Itoh, NTT Review, Vol 3, No. 5 September 1991) to use an artificial voice signal (i.e. a signal which is similar in a spectral sense to the human voice, but which does not convey any intelligence) in conjunction with a conventional distortion analysis measure such as the cepstral distance (CD) measure, to measure the performance of telecommunications apparatus.

It would appear obvious, when testing apparatus such as a codec which is designed to encode human speech, and when employing an analysis method based on the human ear, to use real human speech samples as was proposed in the above paper by Beerends and Stemerdink. In fact, however, the performance of such test systems is not particularly good.

BRIEF SUMMARY OF THE INVENTION

Our earlier International application PCT/GB93/01322 published on 6th Jan. 1994 as WO94/00922 (now parent U.S. application Ser. No. 08/351,421 filed Dec. 12, 1994) discloses a test system using an artificial speech test signal and a perceptual model analysis method.

Accordingly, it is an object of the invention to provide an improved telecommunications testing apparatus and method. It is another object of the invention to provide a telecommunications testing apparatus which can provide a measure of the performance of telecommunications system which matches the subjective human perception of the performance of the system.

In a paper "NMR and "Masking Flag": Evaluation of Quality using Perceptual Criteria", Brandenburg and Sporer demonstrate the display of various distortion effects as plots of distortion amplitude against frequency and against time, (using real speech and music samples as in the Beerends paper). However, these results do not give a quantitative measure of the distortion. Moreover, the plot of amplitude against time gives no spectral information, and vice versa Beerends and Stemerdink, in a paper entitled "A Perceptual Audio Quality Measure Based on a Psychoacoustic Sound Representation", Journal of the Audio Engineering Society Audio/Acoustics/Applications Vol 40, No. 12, December 1992 pages 963–978) discuss a quantitative measurement of distortion $L_N$. This measure is an integral over time and frequency (adjusted to a non-linear (pitch) scale) of a distortion value which is related to loudness of the error signal, but modified according to time and pitch to introduce masking effects, threshold values and other perceptual factors.

The present invention provides, in one aspect, telecommunications testing apparatus comprising analysis means arranged to receive a distorted signal which corresponds to a test signal when distorted by telecommunications apparatus to be tested, the analysis means comprising means for deriving, from the distorted signal, a plurality of spectral component signals responsive to the distortion in each of a plurality of spectral bands, over a succession of time intervals, the analysis means being arranged to generate a measure of the subjective impact of the distortion due to the telecommunications apparatus, said measure of subjective impact being calculated to depend upon the distribution of the distortion over time and said spectral bands.

Viewed in another aspect, the invention provides a method of assessing the distortion caused by telecommunications apparatus, in which the spectral and temporal distribution of the distortion is used to assess the perceived impact of the distortion.

This invention provides a measure of the distortion which is related to the distribution of the distortion over the time and spectral domains, or its concentration in a small area of these domains. Conveniently, the analysis means (8) is arranged to derive a measure $E_E$, referred to herein as "error entropy", of the distribution of said distortion over time and said spectral bands, and is further arranged to derive a measure $E_A$ of the total amount of said distortion over a predetermined time segment, and to calculate a measure of $Y_{LE}$ of said subjective impact based on said measures of distribution $E_E$ and total distortion $E_A$. This value $Y_{LE}$ has a correlation with the perceptual importance of the distortion.

Preferably the measure of distribution $E_E$ is determined as the sum over all time intervals (i) and spectral bands (j) of the value: $-a(i,j) \cdot \ln(a(i,j))$, where $a(i,j)$ is the absolute magnitude of the distortion in a predetermined time interval (i), and spectral band (j), expressed as a proportion of the total distortion over all time intervals (i) and spectral bands (j).

If an error amplitude scale using logarithmic units is used, the values of $a(i,j)$ are conveniently related exponentially to the scale units.

Other aspects and preferred embodiments of the invention will be apparent from the following description and claims.

BRIEF DESCRIPTION OF THE DRAWINGS

The invention will now be illustrated, by way of example only, with reference to the accompanying drawings in which:

FIG. 4 shows schematically the structure of a test signal over time;

FIG. 5a is a graph of the level of masked noise (dBs) against a pitch (e.g. approximately logarithmic frequency) axis in critical band rate (Bark) units, for different levels of masking noise; and FIG. 5b is a diagram showing the variation of excitation threshold on a pitch (approximately logarithmic frequency) axis in critical band rate (Bark) units, for masking noise at seven given frequencies;

FIG. 9a is a diagram of distortion amplitude over pitch and time axes representing a low magnitude nonlinear distortion of the speech signal depicted in FIG. 8a;

FIG. 10a shows substantially a plot of distortion amplitude over time and pitch axes for homogeneous distortion;

FIG. 10b is a table showing the amplitude values for the cells of the plot of FIG. 10a;

FIG. 12b is a corresponding table of amplitude values; and

FIG. 12c is a table of amplitude values corresponding to the multiplication of the distortion of FIG. 12a by a factor of 10;

DETAILED DESCRIPTION OF EXEMPLARY EMBODIMENTS

Overview of Apparatus

Figure 1:
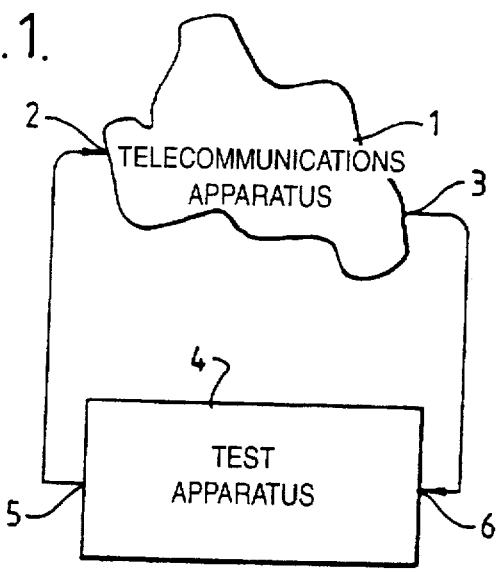
FIG. 1 is a block diagram showing the arrangement of an embodiment of the invention in use.

Referring to FIG. 1, telecommunications apparatus 1 comprises an input port 2 and an output port 3. Test apparatus 4 comprises an output port 5 for coupling to the input port 2 of the telecommunications apparatus under test, and an input port 6 for coupling to the output port 3 of the telecommunications apparatus under test.

Figure 2:
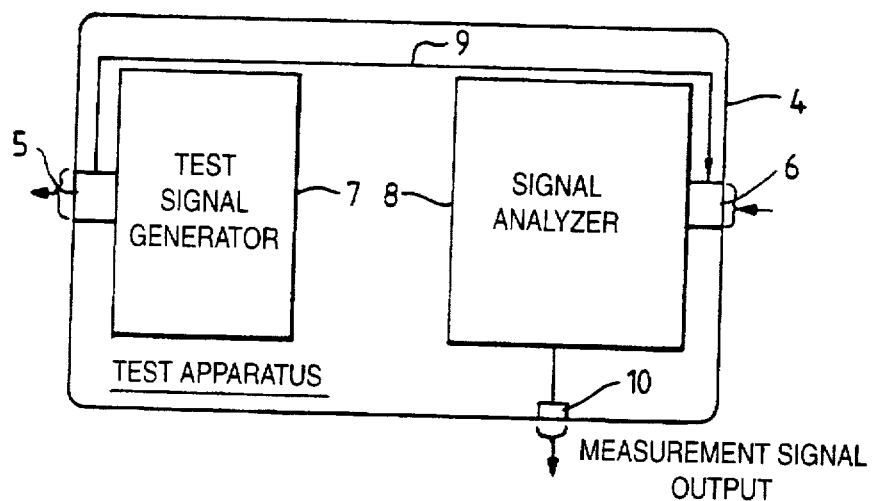
FIG. 2 is a block diagram showing in greater detail the components of an embodiment of the invention.
Figure 3:
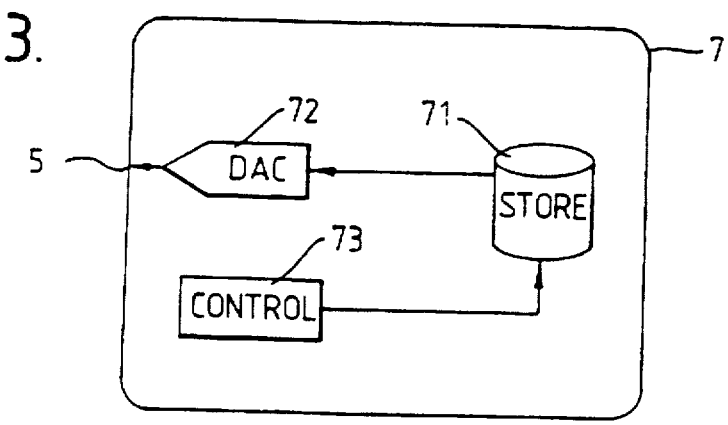
FIG. 3 is a block diagram showing in greater detail a test signal generator forming part of the embodiment of FIG. 2.

Referring to FIG. 2, the test apparatus 4 comprises a test signal generator 7 coupled to the output port 5, for supplying a speech-like test signal thereto, and a signal analyzer unit 8 coupled to the input port 6 for analyzing the signal received from the telecommunications apparatus 1. As will be discussed in greater detail below, the analyzer 8 also utilises an analysis of the test signal generated by the test signal generator 7, and this is indicated in this embodiment by a path 9 running from the output port 5 to the input port 6.

Also provided from the analysis unit 8 is a measurement signal output port 10 at which a signal indicating some measure of the acceptability of the telecommunications apparatus (for example, distortion) is provided either for subsequent processing, or for display on a visual display unit (VDU), not shown.

First Embodiment

Speech Signal Generation

In its simplest form, the artificial speech generator may merely comprise a digital store 71 (e.g. a hard disc or digital audio tape) containing stored digital data from which a speech signal can be reconstituted. The stored data may be individual digitised speech samples, which are supplied in succession from the store 71 to a signal reconstituting means 72 (e.g. a digital to analog convertor (DAC)) connected to the output port 5. The sample data stored in the store 71 comprises one or more speech utterances lasting several seconds in length (for example, on the order of ten seconds).

Alternatively, the store 71 may store speech data in the form of filter coefficients to drive an LPC speech synthesizer, for example, or higher level data (e.g. phoneme, pitch and intensity data) to drive a phoneme synthesizer comprising the reconstituting means.

A control circuit 73 (e.g. a microprocessor) controls the operation of the store unit 71 to select a particular test signal to be output.

Referring to FIG. 4, the test signal data stored in the store 71 is reconstituted to form a test signal comprising a plurality of segments $t_0, t_1, t_2 \ldots t_n$.

Each of the segments $t_0$–$t_n$ typically corresponds to a different speech sound (e.g. a different phoneme) or to silence. One known artificial voice test signal is disclosed in CCITT Recommendation P50 (Recommendation on Artificial Voices, Vol. Rec P50, Melbourne 1988, published by CCITT). In the P50 test signal, each segment lasts 60 ms.

The segments are grouped into patterns each comprising a randomly selected sequence of 16 predetermined spectral patterns, defined by the recommendation, with spectrum densities $S_i(f)$ equal to $$\text{Spectrum density } S_i(f) = 1/\left( A_{ij} + 2 \sum_{j=1}^{12} A_{ij}[\cos(2\pi i f)] \right)$$

$i = 1, 2, \ldots 16$

The transition between the different segments in each pattern is arranged to be smooth. Of the patterns, 13 correspond to voiced speech and the remaining 3 to unvoiced speech. A sequence of speech can either be stored on a recording medium and reproduced, or can be generated from stored data using a vocodec as described in the above referenced Irii paper, for example.

The P50 signal has a long term and short term spectral similarity to speech when averaged over about 10 seconds. Accordingly, preferably, the speech sequence shown in FIG. 4 lasts at least this long. Certain types of process, referred to below as "process with memory" exist in which the behaviour of a current speech element varies according to which speech element preceded it. These are not tested for adequately by the standard P50 signal because speech elements are selected randomly in that signal.

In an improvement over the standard P50 signal, the sequence of predetermined spectral patterns is not selected randomly, but instead the sequence is selected to represent sequences which occur in spoken language. This ensures that processes with memory are approximately exercised by the test signal.

Distortion

The signal leaving the telecommunications apparatus 1 under test differs from the test signal supplied to the input port 2. Firstly, there will be time-invariant linear distortions of the signal, resulting in overall changes of amplitude, and in filtering of the signal so as to change its spectral shape. Secondly, noise will be added to the signal from various sources, including constant noise sources (such as thermal noise) and discontinuous sources (such as noise bursts, dialling pulses, interference spikes and crossed lines). Thirdly, there will be nonlinear and time-varying distortions of the signal due to nonlinear elements such as codecs and time-varying elements such as echo cancellers and thresholders.

The presence of nonlinear distortion can cause intermodulation between noise and the signal, and the distortion at the output port 3 therefore depends not only upon the signal and the apparatus 1 but also the noise. Further, the presence of time-varying distortion, triggered by the signal but acting after a delay, means that the distortion applied to any given temporal portion of the signal depends upon preceding temporal portions of the signal and noise; for instance, if high level noise is present before the beginning of a phoneme, a voice activity detector may not clip the phoneme at all, whereas if the phoneme is preceded by silence, the voice activity detector will heavily clip the beginning of the phoneme causing substantial distortion.

Analyzer 8

The analysis according to the present invention is intended to provide an acceptability signal output which depends upon the distortion of the test signal similarly to the response of a human ear, as it is presently understood.

Without dwelling upon the physical or biological mechanisms giving rise to these phenomena, it is well known that the human perception of sound is affected by several factors. Firstly the presence of one sound "masks" (i.e. suppresses the perception of) another sound in a similar spectral (frequency) region. The extent to which the other sound is masked depends upon, firstly, how close in pitch it is to the first sound and, secondly, to the amplitude of the first sound.

Thus, the human perception of errors or distortions in a sound depends upon the sound itself; errors of low amplitude in the same spectral region as the sound itself may be masked and correspondingly be inaudible (as, for example, occur with quantising errors in sub band coding).

Secondly, the masking phenomenon has some time dependence. A sound continues to mask other sounds for a short period after the sound is removed; the amplitudes of the subsequent sounds which will be masked decay rapidly after the removal of the first sound. Thus, errors or distortions will be masked not only by the present signal but also by portions of the signal which preceded it (to a lesser extent). This is referred to as "forward masking". It is also found that the application of a high level sound just after a lower level sound which would otherwise have been audible retrospectively makes the earlier sound inaudible. This is referred to as "backward masking".

Thirdly, the human ear is not directly responsive to the frequency, but to the phenomenon perceived as "pitch" of a sound, which corresponds to a nonlinear warping of the frequency axis.

Fourthly, the human ear is not directly responsive to amplitude, even when a signal is not masked, but to the phenomenon perceived as loudness which is a nonlinear function of amplitude.

Accordingly, in this embodiment the analyzer 8 is arranged to process the signal received from the telecommunications equipment 1 to determine how significant or objectionable the distortion produced thereby in the test signal will be to a human listener, in accordance with the above known characteristics of the human ear.

More particularly, the analysis unit 8 is arranged to determine what the response of the human ear will be to the test signal generated by the test signal generator 7; and then to similarly process the signal from the telecommunications apparatus output 3 to determine the extent to which it perceptibly differs from the original test signal, by determining the extent to which distortions are perceivable.

FIG. 5a shows schematically the variation of the spectral masking threshold (the threshold above which a second sound is obscured by a first) for narrow band noise at a fixed frequency. The five curves are for progressively higher levels of masking noise, and it will be seen that the effect of increasing the level of masking noise is to cause a roughly linear increase in the masking threshold at the masking noise frequency, but also to change the shape of the threshold away from the noise frequency (predominantly towards higher frequencies). The masking effect is therefore amplitude nonlinear with respect to the amplitude of the masking noise.

For a given masking noise level, the width (measured, for example, at the 3 dB points below the central masking frequency) of the masked spectral band varies with the frequency of the masking noise. This variation of the width of the masked bands is related to the characteristic of the human auditory filter shape for frequency discrimination, and therefore to the human perception of pitch.

Accordingly, as shown in FIG. 5b, a scale of pitch, rather than frequency, can be generated from the frequency scale by warping the frequency scale, so as to create a new scale in which the widths of masking bands are constant. FIG. 5b shows the critical band rate, or Bark, scale which is derived by considering a set of narrow band masking tones at different frequencies which cross at the −3 dB point. This scale is described, for example, in "Audio Engineering and Psychoacoustics: Matching Signals to the Final Receiver, the Human Auditory System", J. Audio Eng. Soc. Vol. 39, March 1991, Zwicker and Zwicker.

The critical bands shown in FIG. 5b are similar in shape (on the frequency axis) below 500 hertz when represented on a linear frequency scale. Above 500 hertz, they are similar in shape when viewed on a logarithmic frequency scale. Since the telephony band width is typically 300 to 3150 hertz, and telecommunications apparatus is often band limited to between these limits, the transformation to the pitch scale in this embodiment ignores the linear region below 500 hertz with only a small compromise in accuracy.

Figure 6:
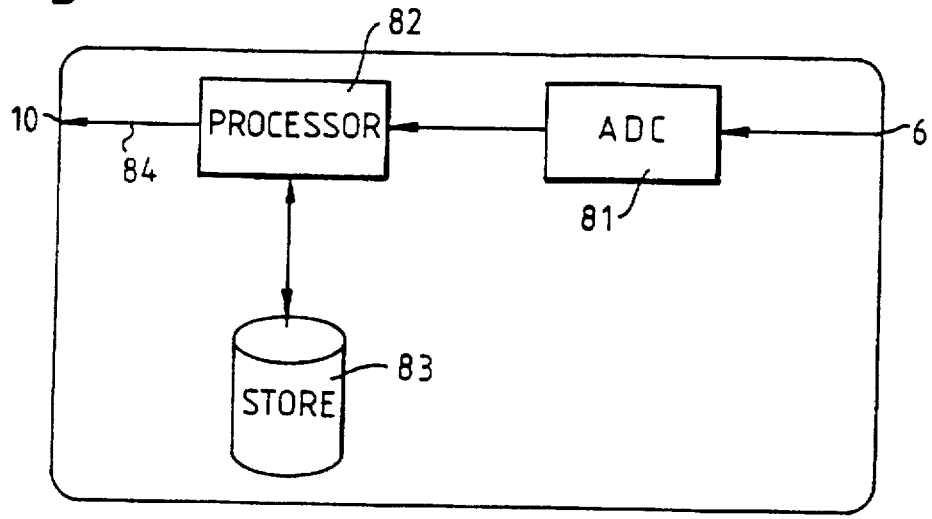
FIG. 6 is a block diagram showing in greater detail an analysis unit forming part of the embodiment of FIG. 2.

Referring to FIG. 6 the analysis unit 8 comprises an analog to digital converter (ADC) 81 arranged to receive signals from the input port 6 and produce a corresponding digital pulse train; an arithmetic processor 82 (for example, a microprocessor such as the Intel 80486 processor, or a digital signal processing device such as the Western Electric DSP 32C or the Texas Instruments TMS C30 device), coupled to receive the digital output of the ADC 81, a memory device 83 storing instruction sequences for the processor 82 and providing working memory for storing arithmetic results, and an output line 84 from the processor 82 connected to the output 10.

Figure 7B:
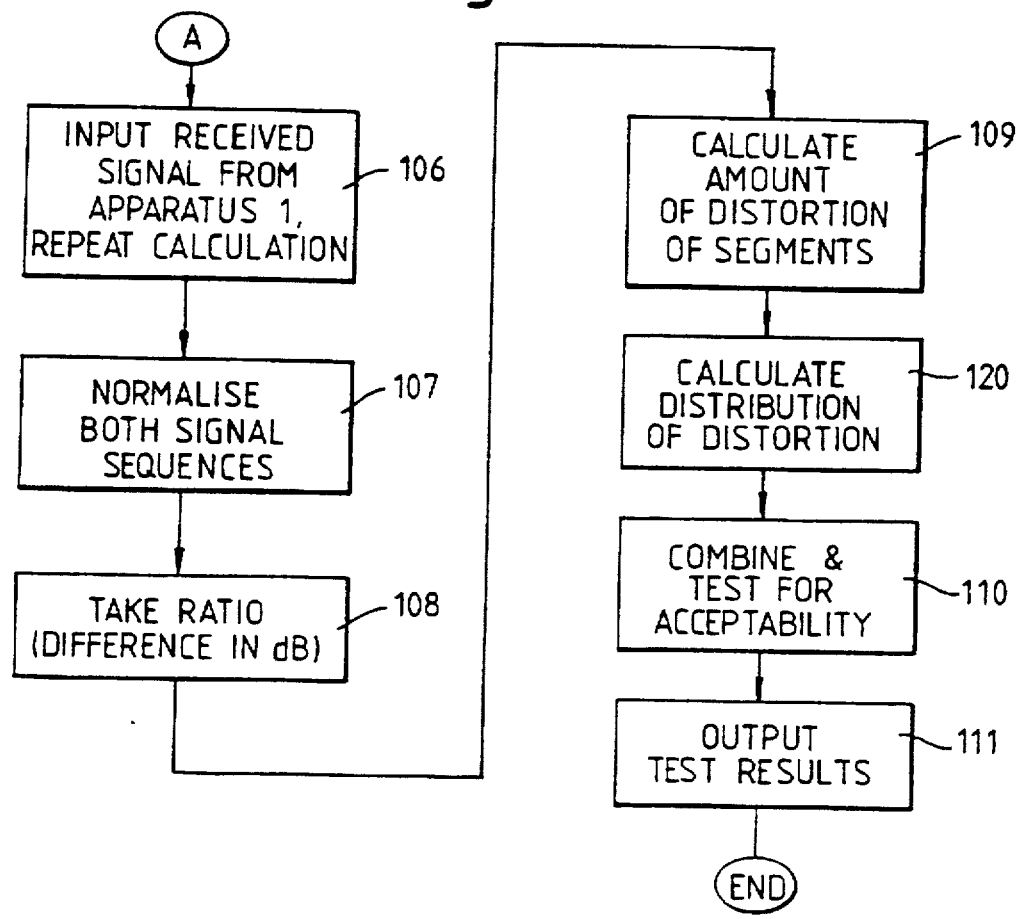
FIGS. 7a and 7b form a flow diagram indicating schematically the operation of the analysis unit in the embodiment of FIG. 6.
Figure 7A:
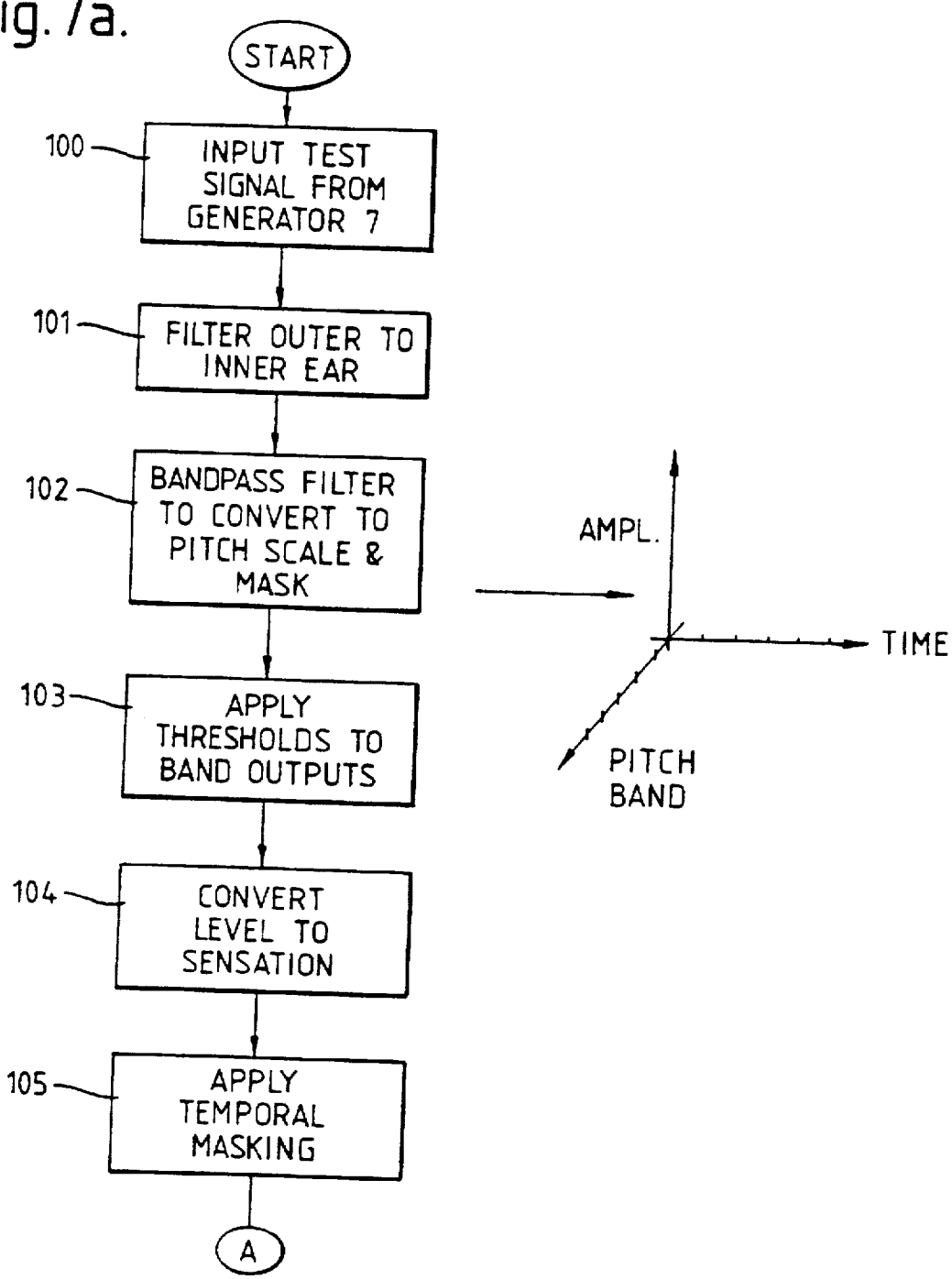

Referring to FIGS. 7a and 7b, the processes performed by the processor 82 in this embodiment will now be described.

Firstly, the test signal supplied from the test signal generator 7 is input directly to the input port 6 in a step 100, without passing through telecommunications apparatus 1.

In the next step 101, the signal from the ADC 81 is filtered by a filter which corresponds to the transfer function between the outer portions of the ear and the inner ear. The filtering may typically be performed by executing a digital filtering operation in accordance with filter data stored in the memory 83. The filter may be characterised by a transfer function of the type described in "Psychoacoustic models for evaluating errors in audio systems", J. R. Stuart, Procs. IOA, vol. 13, part 7, 1991.

In fact, the transfer function to the inner ear will vary slightly depending upon whether the sound is coupled closely to the ear (e.g. through a headset) or more distantly (e.g. from a loudspeaker); accordingly, the processor 82 and store 83 may be arranged to store the characteristics of several different transfer functions corresponding to different sound locations related to the type of telecommunications apparatus 1 on test, and to select an appropriate filter in response to a user input specifying the telecommunications apparatus type. The filtered signal after the execution of the step 101 corresponds to the signal as it would be received at the inner ear.

Next, in a step 102, the signal is split into a plurality of spectral bands having bandwidths which vary logarithmically with frequency so as to effect the transformation from frequency to pitch. In this embodiment, the signal is bandpass filtered into 20 bands each one-third of an octave in bandwidth, from 100 hertz to 8 kilohertz, according to International Standard ISO 532B; the ISO band filters are similar in shape when viewed on a logarithmic frequency axis and are well known and documented. The average signal amplitude in each of the 20 bands is calculated each 4 milliseconds, and the signal after filtering thus comprises a series of time segments each comprising 20 frequency band amplitude values. This bandpass filtering is performed for all the values in the test signal (which lasts on the order of several seconds, for example, 10 seconds).

The relatively wide filters take account of the masking within each filter band, and the broad, overlapping skirts of the filters ensure that spectral masking due to neighbouring frequencies is also taken account of.

Next, in step 103, frequency dependent auditory thresholds specified in International Standard ISO 226 are applied to each of the band outputs. This simulates the effect of the minimum audibility threshold indicated in FIG. 5a.

Next, in step 104, the bandpass signal amplitudes are converted to a phone or sensation level which is more equivalent to the loudness with which they would be perceived by a human auditory system. The conversion is non-linear, and depends upon both signal amplitude and frequency. Accordingly, to effect the conversion, the equal loudness contours specified in international standard ISO 226 are applied to each of the band outputs. Both these equal loudness contours and the thresholds used in step 103 are stored in the memory 83.

Next, in step 105, a temporal masking (specifically forward masking) is performed by providing an exponential decay after a significant amplitude value. In fact, the rate of decay of the masking effect depends upon the time of application of the masking sound; the decay time is higher for a longer time of application than for a shorter time. However, in this embodiment, it is found sufficient to apply a fixed exponentially weighted decay, defined by $y = 56.5 \cdot 10^{(-0.01x)}$, (where y represents level and x represents time) which falls between the maximum decay (corresponding to over 200 milliseconds duration) and the minimum decay (corresponding to 5 milliseconds duration) encountered in practice.

In applying the forward masking, at each time segment for each bandpass filter amplitude, masking values for the corresponding bandpass in the three following time segments are calculated, using the above exponential decay. The three values are compared with the actual amplitudes of those bands, and if higher than the actual amplitudes, are substituted for the actual amplitudes.

As noted above, it is also possible for a sound to mask an earlier occurring sound (so called "backward masking"). Preferably, in this embodiment, the forward masking process is replicated to perform backward masking, using the same type of exponential decay, but with different numerical constants (in other words, for each time segment, values of masking for earlier occurring time segments are calculated, and if higher than the actual amplitudes for those bands, are substituted for the actual amplitudes).

Thus, after step 105 the calculated signal data comprises a succession of time segment data each comprising 20 bandpass signal amplitudes, thresholded so that some amplitudes are zero, and the amplitude of a given band in a given time segment being dependent upon the amplitudes of corresponding bands in past and future time segments due to the forward and backwards masking processing.

This corresponds to a surface indicating, along the signal pitch and time axes, the masking effect which the test signal would have had upon the human ear if directly applied without the telecommunications apparatus 1.

Figure 8A:
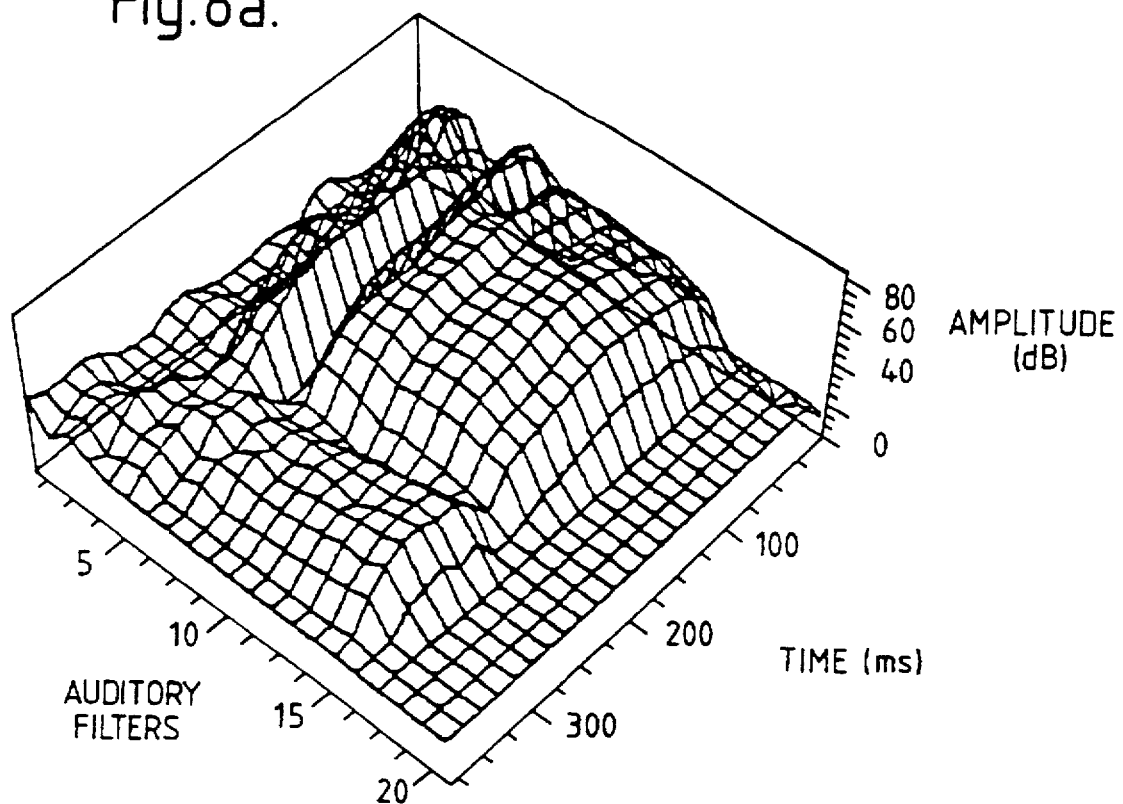
FIG. 8a shows schematically an estimate formed in this embodiment of amplitude of excitation, as a function of time and pitch, which would be produced in the human ear by a predetermined speech-like signal.
Figure 8B:
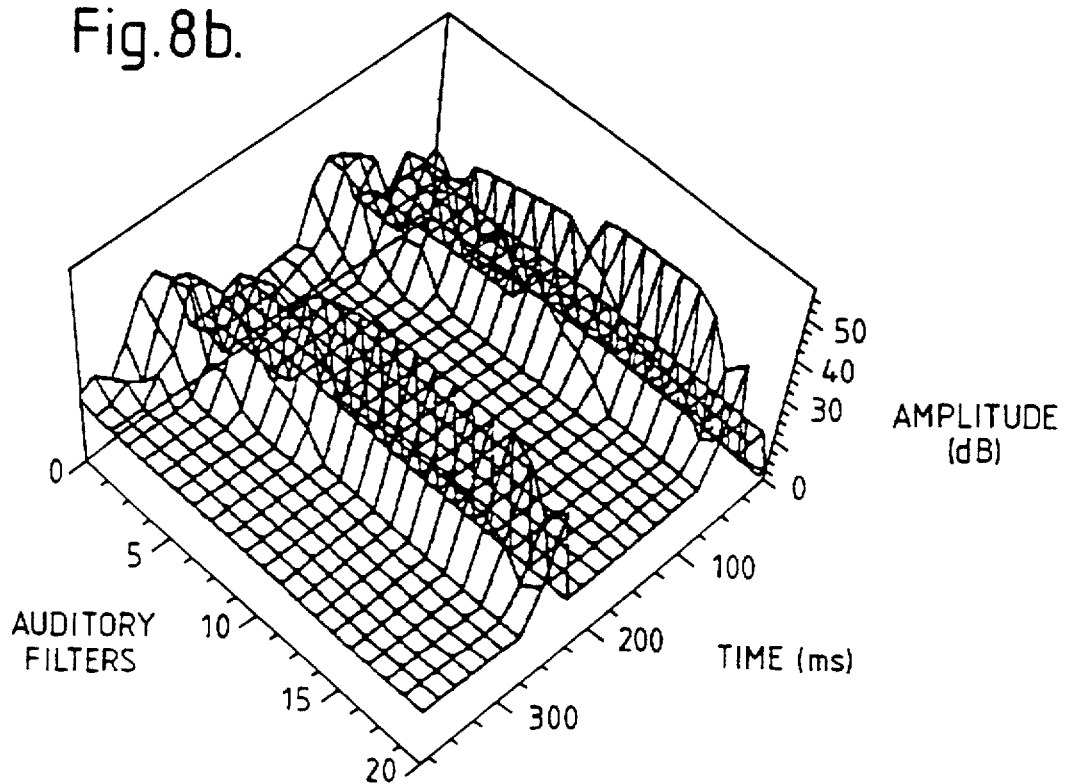
FIG. 8b is a corresponding plot showing the excitation which would be produced by two spaced clicks.

FIGS. 8a and 8b show excitation surfaces generated by the above process. FIG. 8a corresponds to a speech event comprising a voiced sound followed by an unvoiced sound; the formant structure of the first sound and the broad band nature of the second sound can readily be distinguished. FIG. 8b shows a corresponding surface for two clicks, and the effect of the forward masking stage 105 of FIG. 7a is clearly visible in the exponential decays therein.

Next, in step 106, the test signal generator 7 repeats the test signal but this time it is supplied to the input port 2 of the telecommunications apparatus 1, and the output port 3 thereof is connected to the input port 6 of the test apparatus 4. The calculation stages 101–105 are then repeated, to calculate a corresponding surface for the received signal from the telecommunications apparatus 1.

Having calculated the effect on the ear (excitation) of the original test signal and of the output from the telecommunications apparatus (the distorted test signal), the difference in the extent to which the two excite the ear corresponds to the level of distortion of the test signal as perceived by the human auditory system. Accordingly, the amplitude transfer function of the telecommunications apparatus is calculated, for each segment, by taking the ratio between the corresponding bandpass amplitudes (or where, as in FIG. 8a or 8b, the bandpass amplitudes are represented on a dB scale, by taking the difference between the amplitude in dBs). To avoid an overall gain term in the transfer function, which is irrelevant to the perceived distortion produced by the telecommunications apparatus, each bandpass term may be normalised by dividing (or, when represented in dBs, subtracting) by the average amplitude over all bandpass filter outputs over all time segments in the test signal sequence, in step 107.

If the original test signal and the output of the telecommunications apparatus 1 are identical, but for some overall level difference (that is to say, if the telecommunications apparatus 1 introduces no distortion), the ratio between each bandpass filter output of the two signals will be unity, and the logarithmic difference in dBs in amplitude will be zero; accordingly, the plot of the surface representing the distortion over time and pitch to would be completely flat at all times and in all pitch bands. Any deviation is due to distortion in the telecommunications apparatus. Additive distortion errors will-appear as peaks, and signal loss will appear as troughs, relative to the undistorted average level.

The sequence of sets of bandpass auditory excitation values (corresponding to a surface along the time and pitch axes) is divided into contiguous sectors of length 96 milliseconds (i.e. 48 successive 2 millisecond segments) so as to include at least two different values for the lowest pitch band. The total amount of error or error activity, is calculated in step 109 as:

$$\text{Error Activity}, E_A = \sum_{i=1}^{48} \sum_{j=1}^{20} |c(i,j)|$$

where $c(i,j)$ is the error value in the $i^{th}$ time segment and $j^{th}$ pitch band of the error surface sector to be analyzed.

This gives an indication of the absolute amount of distortion present.

Then, the distribution of the error over time and pitch (or rather, the entropy of the distortion, which corresponds to the reciprocal of the extent to which the energy is distributed) is calculated in step 120 as follows:

$$\text{Error entropy } E_E = -\sum_{i=1}^{48} \sum_{j=1}^{20} a(i,j) \cdot \ln(a(i,j))$$

$$\text{where } a(i,j) = \frac{|c(i,j)|}{E_A}$$

The log term in the above expression controls the extent to which the distribution of energy affects the entropy $E_E$, acting as a non-linear compression function.

It is found that the error activity and error entropy criteria together correspond well to the subjectively perceived level of distortion, as the listener will find a high level of error considerably more noticeable if it is concentrated at a single pitch over a short period of time, rather than being distributed over pitch and time.

The two measures are combined, together with appropriate weightings, and the combined measure is thresholded in step 110. An output signal is generated (in step 111) to indicate whether or not the threshold has been passed.

Figures 10A, 10B:
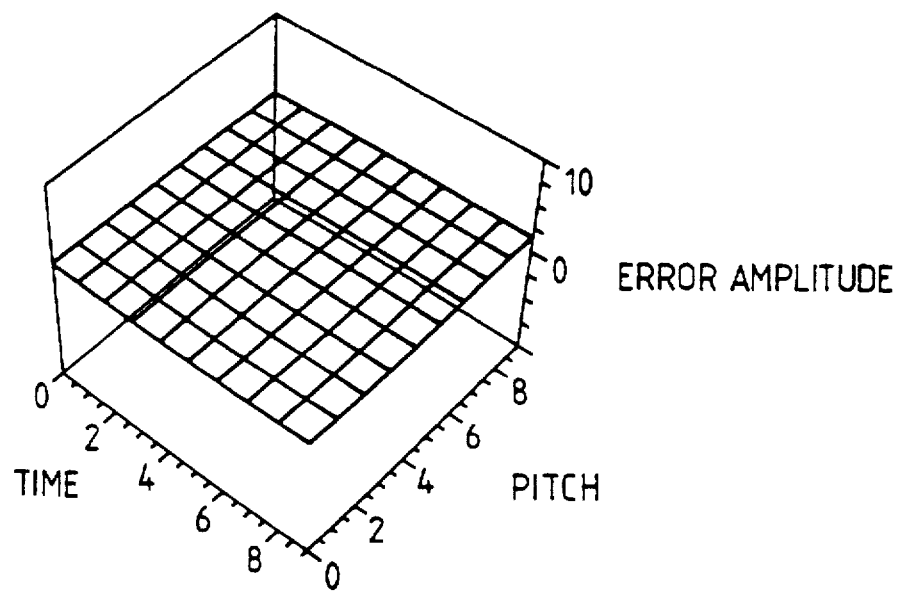

Referring to FIGS. 10a and 10b, where the error is uniformly distributed over time and pitch as shown in FIG. 10a, the total error activity $E_A$ is 200 and the error entropy is $E_E$ is at a relatively high level of 4.605.

Figures 11A, 11B:
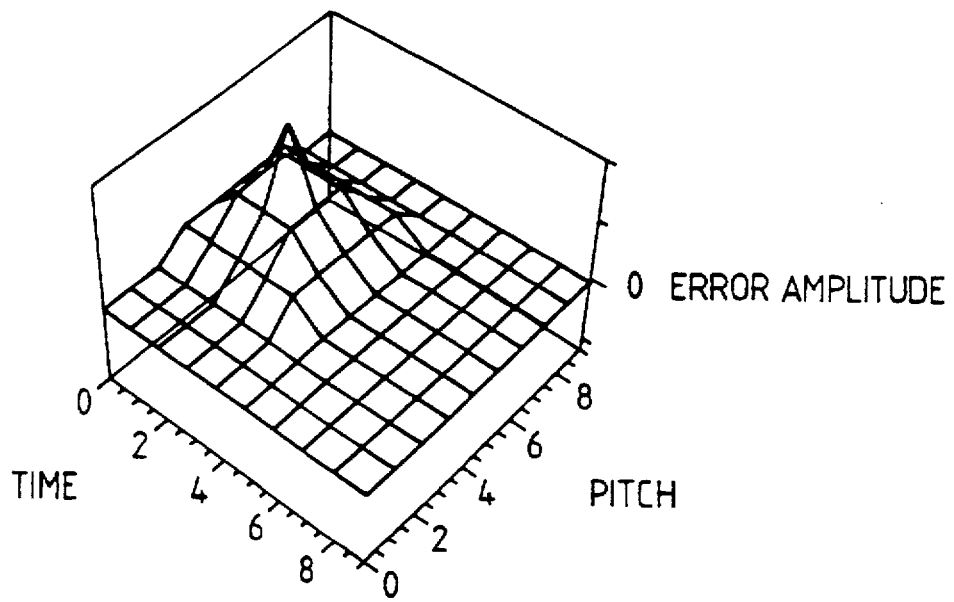
FIG. 11a is a plot corresponding to FIG. 10a for a first non-homogeneous distortion.
FIG. 11b is a corresponding table of amplitude values.

Referring to FIGS. 11a and 11b, the same amount of total error (error activity $E_A$=200) is distributed substantially into a broad peak. The error entropy $E_E$ is correspondingly lower ($E_E$=3.294).

Figure 12A:
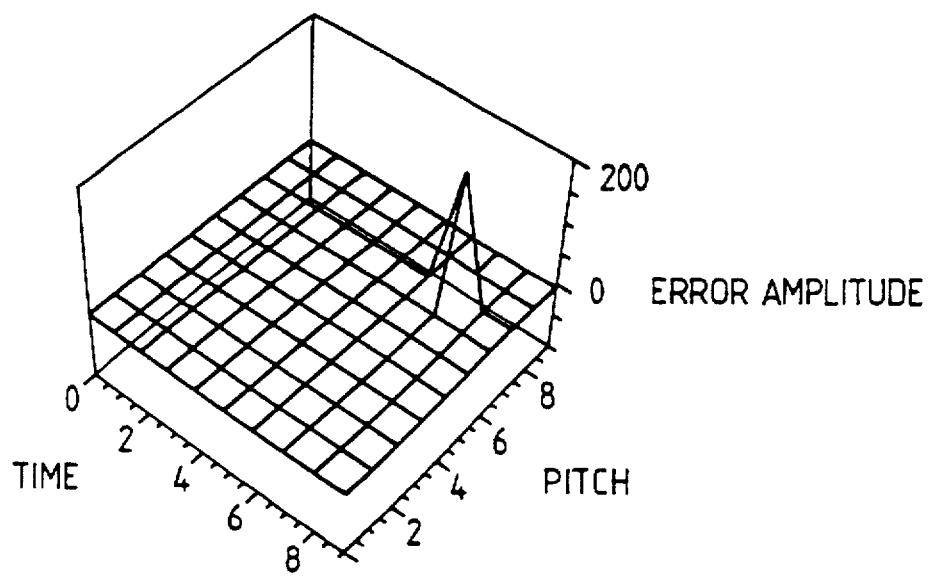
FIG. 12a is a plot corresponding to FIG. 10a for a second non-homogeneous distortion.

Referring now to FIGS. 12a and 12b, where the same amount of error is contained in a single spike in a single time/pitch cell, the error entropy is much lower ($E_E$=0.425).

FIG. 12c illustrates the effect which would be achieved by scaling the error at every time/pitch cell by 10. The total amount of error ($E_A$) has increased to 2000, but the error entropy ($E_E$) is still 0.425.

Thus, the error entropy $E_E$ gives a measure of the distribution of the error which is independent of the magnitude of the total amount of error, whereas the error activity $E_A$ gives a measure of the amount of error which is independent of its distribution.

In fact, to take account of the logarithmic units of the audible error amplitude scale employed in this embodiment, it is convenient to recast $E_A$ and $E_E$ as $E'_A$ and $E'_E$, as follows:

$$E'_A = \sum_{i=1}^{n} \sum_{j=1}^{m} 10^{|c(i,j)|}$$

and $$E'_E = -\sum_{i=1}^{n} \sum_{j=1}^{n} \frac{10^{c(i,j)}}{E_A} \cdot \ln\left(\frac{10^{c(i,j)}}{E_A}\right)$$

The error activity and error entropy measures can then be combined to give a good indication of what the subjective listener response to distortion would be, in a manner which is relatively robust to the actual nature of the distortion.

For example, we have found that a good indication of the subjective "listening effort" measurement $Y_{LE}$ is given by $$Y_{LE} = -a_1 + a_2 \log_{10} E'_A + a_3 E'_E$$

where $a_1=8.373$; $a_2=0.05388$; and $a_3=0.4090$.

In greater detail, therefore, the process performed by the analyzer 8 in the combining step 110 comprises:

1. Calculating $E'_E$ and $E'_A$ for each time segment of the test signal.
2. Summing the error activity and error entropy values over time to form an average value of the error activity $E'_A$ and an average value of the error entropy $E'_E$ over the whole duration of the test signal.
3. Using these values, forming a measure of the subjective impact of distortion, $Y_{LE} = -a_1 + a_2 \log_{10} E'_A + a_3 E'_E$.

The averages formed in step 2 above may simply be arithmetic means, or (with appropriate scaling elsewhere in the combination process) sums. However, preferably, the averages are formed with different weightings being given to the error activity and error entropy values from different time segments, depending upon their importance to a listener. For example, segments of the test signal which correspond to sounds which occur frequently in natural speech may be given a higher weighting, since distortion of these sounds will be particularly noticeable to the listener. Further, a higher weighting may be given to time segments which follow time segments containing silence, so that the noticeable effects of clipping of the beginnings of words (which considerably reduces intelligibility) due to the delayed onset of voice switches are given a high weighting. Further details are in our International Patent Application PCT/GB94/01305 (published on 5th Jan. 1995 as WO95/01011).

Further details of the derivation of the function used to combine the error activity and error entropy value in the step 110 will now be discussed.

Figure 13:
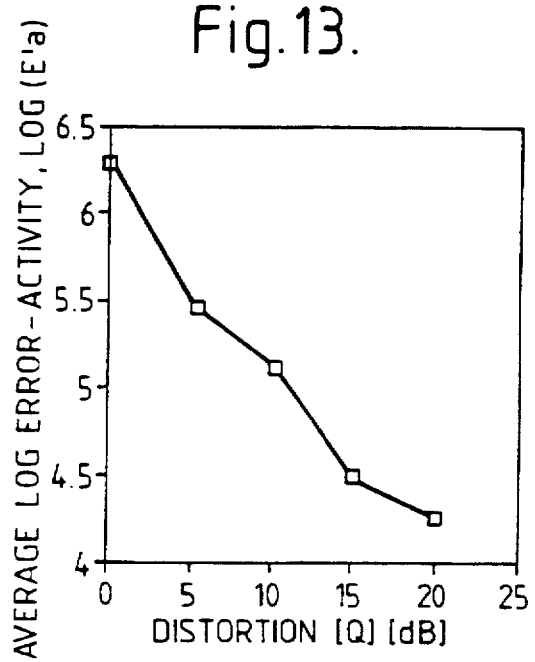
FIG. 13 is a graph relating error magnitude to level of distortion of one example of imposed MNRU distortion.

The effects of modulated noise reference unit (MNRU) distortion were added to prerecorded files of human speech, used as test signals in place of the signal generator 7, and average error activity and error entropy values were derived using the analyser 8 following steps 101 to 120 described above. The analysis was repeated for different levels of distortion, and the resulting error activity and error entropy values are plotted against the level of distortion in FIGS. 13 and 14 respectively. It will be seen that the log error activity is approximately negatively proportional to the level of distortion, and that the error entropy is approximately proportional to the level of distortion.

Figure 15:
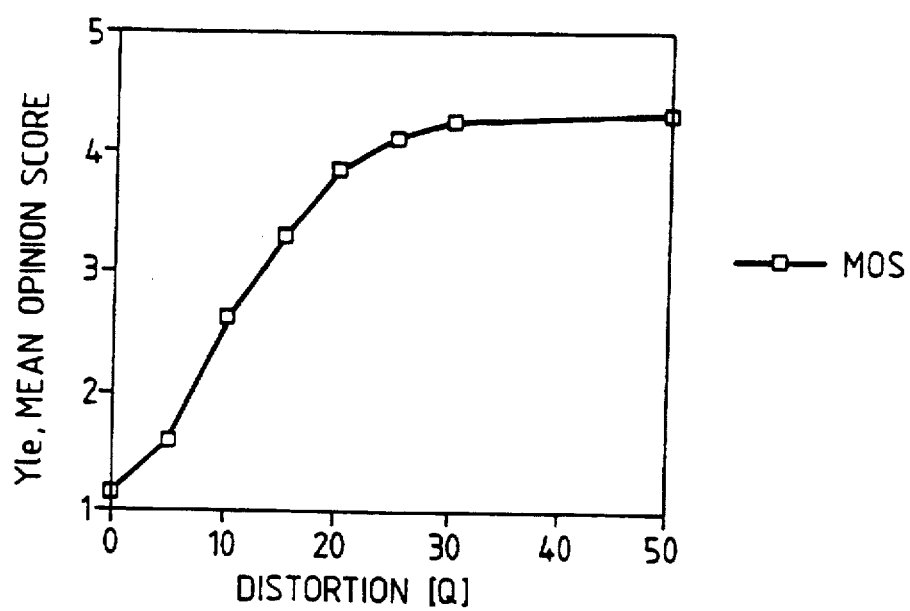
FIG. 15 is a graph relating a subjective assessment of distortion by human listeners to imposed distortion in the same example.

Next, the same distorted speech was played to a panel of human listeners, who provided measurements of listening effort $Y_{LE}$ according to internationally followed experimental practice, on a scale of 1–5. The average of the human listeners scores for the varying levels of distortion is shown in FIG. 15. The shape of the relationship of FIG. 15 can be described by:

$$(Y-1)/(Ymax-1) = 1/(1+e^{4S(M-Q)})$$

where Y is the opinion score, $S=0.0551$, $M=11.449$, $Ymax=4.31$, and Q is the equivalent quantisation distortion in dB.

Figure 14:
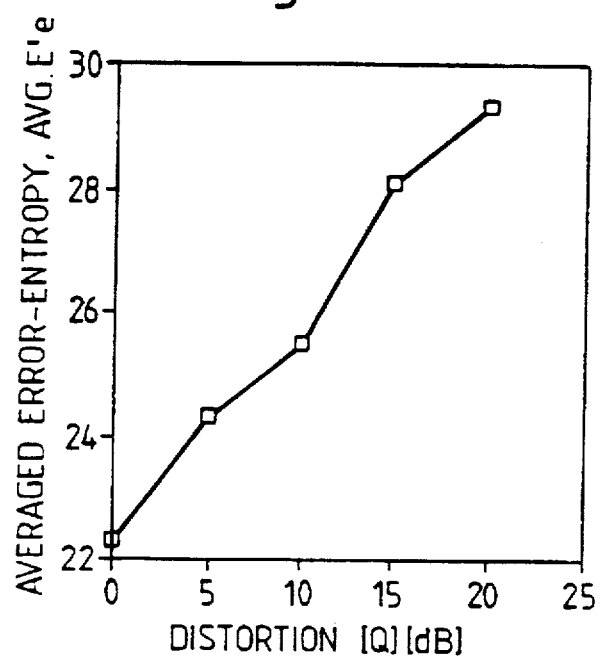
FIG. 14 is a graph relating error distribution to imposed distortion in the same example.

Next, the log error activity values and the error entropy values shown in FIGS. 14 and 15 were fitted, by linear regression, to the distortion levels. The regression gave the relationship:

$$\text{Distortion } Q = -55.09 - 0.5556 \log_{10} E'_A + 2.624 E'_E$$

Next, the relationship between the distortion and the opinion score $Y_{LE}$ subjectively determined by human listeners was used to convert the relationship between distortion and error activity and entropy to a prediction of opinion scores (based on error activity and error entropy). The relationship thus given is:

$$Y_{LE} = -8.373 + 0.05388 \log_{10} E'_A + 0.4090 E'_E.$$

Figure 16:
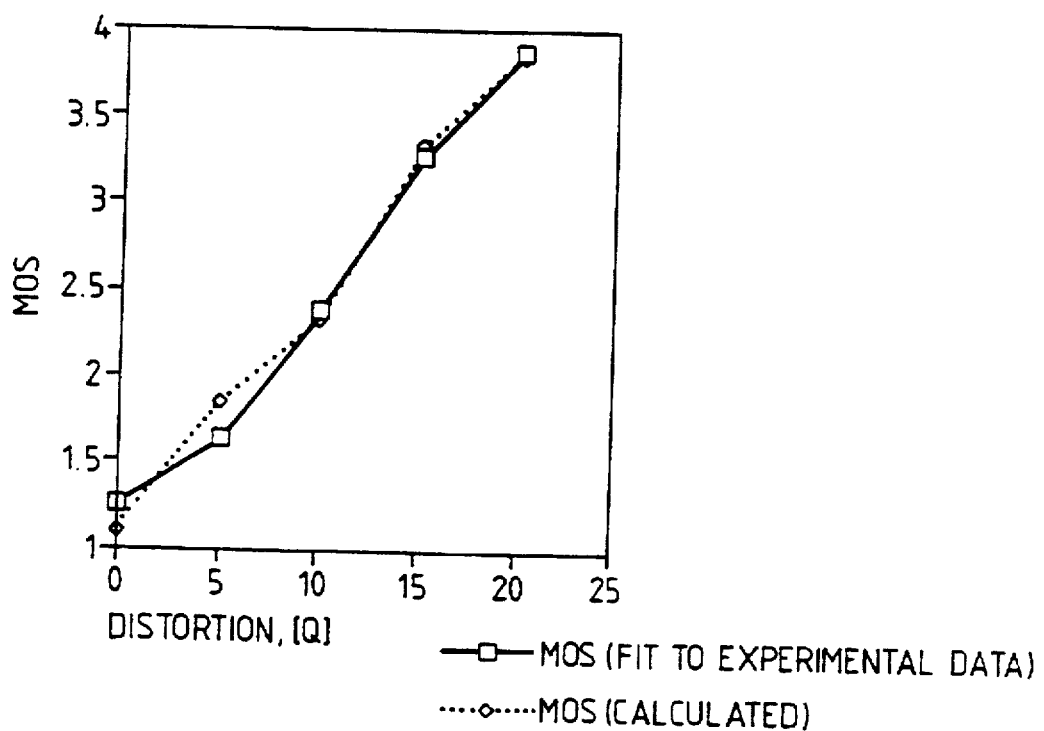
FIG. 16 shows part of the graph of FIG. 15, together with a predicted subjective level of distortion derived according to the invention from the data of FIGS. 13 and 14.

In FIG. 16, the dotted trace shows the predicted subjective opinion score calculated in this manner and the solid line indicates the subjective listener scores (redrawn from FIG. 15). The agreement is seen to be close.

To determine the robustness of the predicted subjective opinion score thus calculated, the last calculation above was utilised in the combining step of an analyser 8 according to the invention. The signal generator 7 in this test merely supplied prerecorded, known, human speech, and the telecommunications apparatus 1 was three commercial low bitrate coder/decoders (codecs). The output of the codecs were also played to a bank of human listeners, who rated the quality of the output, as above, on a scale of 1–5.

The distortion introduced by each codec is complex, but includes some quantisation distortion and some time varying distortion due to adaptation of the codec in use.

The results are reproduced below:

| Coding Algorithm | MOS (Experimental) | MOS (Prediction) |
| --- | --- | --- |
| Commercial low-rate codec A | 3.39 | 2.90 |
| Commercial low-rate codec B | 3.16 | 2.67 |
| Commercial low-rate codec C | 2.65 | 2.94 |

It will be seen that, although the combination step 110 of the analyser 8 was only determined in the context of MNRU distortion, and each of the codecs employed a different type of distortion, the predicted human opinion scores were within 0.5 opinion units (i.e. 10% of the range) for each of the codecs.

Thus, it will be seen that this invention is capable of providing an indication of distortion of telecommunications apparatus which is close to the subjective opinion of a human listener, and is relatively robust to different to different types of distortion.

Second Embodiment

In the second embodiment, the analysis unit 8 is the same or similar to that in the first embodiment. However, the test signal generating unit 7 does not utilise the P50 test signal, but instead generates a different type of artificial, speech-like test signal.

Whilst the P50 test signal is acceptable for many purposes, it is observed to lack a full range of fricative sounds. Furthermore, it has a rather regular and monotonous long term structure, which sounds rather like a vowel-consonant-vowel-consonant . . . sequence. As discussed above, however, since many telecommunications systems include time dependent elements such as automatic gain controls or voice switches, the distortion applied to any given portion of the test signal is partly dependent upon the preceding portion of the test signal; in other words, the context of that portion of the speech signal within the time sequence of the signal as a whole.

Accordingly, in this embodiment, a small, representative, subset of speech segments (selected from the tens of known phonemes) is utilised, and a test signal is constructed from these sounds assembled in different contextual sequences. Since distortion is being measured, it is more important that the test sequence should include successions of sounds which are relatively unlike one another or, more generally, are relatively likely to cause distortion when one follows another. In a simpler form of this embodiment, the test signal might comprise each of the selected segments prefixed by a conditioning portion selected from a high, low or zero level, so that the test signal enables each representative speech segment (phoneme) to be tested following prefixed sounds of different levels. The length of the prefixing signal is selected to extend over the time constants of the system under test; for example, codec adaptation and active gain control takes on the order of a few seconds, whereas speech transducer transient response is on the order of a few milliseconds.

Further details of this embodiment are to be found in the above-mentioned International Patent Application No. PCT/GB94/01305 (published as WO95/01011) the contents of which are incorporated herein by reference in their entirety. The test signal of this embodiment could also be utilised with conventional analysis means.

Third Embodiment

In a third embodiment of the invention, the test signal generator 7 operates in the same manner as in the first or second embodiments. However, the operation of the analysis unit 8 differs in step 102.

Although the logarithmically spaced filters of the first embodiment are found to be a reasonable approximation to the pitch scale of the human ear, it is found that an even better performance is given by the use of filters which are evenly spaced on a Bark scale (as discussed above). Accordingly, in step 102, the twenty bandpass filters are rounded exponential (roex) filters spaced at one Bark intervals on the pitch scale. The round exponential function is described in "Suggested formulae for calculating auditory-filter bandwidths and excitation patterns", (J. Acoust. Soc. Am. 74, 750–753 1983), B. C. J. Moore and M. R Glasburg.

Rather than calculating the average signal amplitude in each band every four milliseconds, in this embodiment, the signal amplitude is calculated over different averaging periods for the different bands, averaging over two milliseconds for the highest pitch band and 48 milliseconds for the lowest pitch band, with intervening averaging times for the intervening bands. It is found that varying the temporal resolution in dependence upon the pitch (or, in general, the frequency) so as to resolve over a longer interval at lower frequencies gives a substantially improved performance.

For subsequent processing, as before, for each two millisecond time segment, an array of bandpass filter output values are generated. For bands lower than the highest pitch, values are repeated more than once for intervening time segments (for example, for the lowest pitch band, each value is repeated 24 times for the two millisecond time segments between each 48 millisecond average amplitude value). It would, of course, be possible to perform a numeric interpolation between succeeding values, rather than merely repeating them.

The steps 103–106 are the same as in the first embodiment (with the adjustment of numerical constants to reflect the different filter responses).

Fourth Embodiment

In this embodiment, the analyser 8 is arranged to perform one further step in the process of FIG. 7b, to calculate the extent to which the distortion of the test signal is correlated to the original test signal generated by the test signal generator 7 over time.

The inclusion of an error-correlation parameter enables the analyser 8 to take account of the (subjectively noticeable) effects which depend on the degree of which any audible error is correlated with the input signal. Similarly it enables the analyser 8 to take account of the (subjectively noticeable) effects of temporally displaced versions of the test signal, known as echo and "pre-echo", (i.e. the early arrival of a small portion of the test signal).

Noise-like errors which are highly correlated with the signal are subjectively less noticeable than a noise-like error of similar energy which is uncorrelated. This is because the listener's brain is busy when listening to the signal, so noise is less distracting than when the brain is not preoccupied with interpreting the signal.

A separate set of correlation values is calculated for one or more of the frequency or pitch bands. Denoting the amplitude value of the difference or transfer function surface calculated in this step 108 for a single frequency band as $x_i$, and the corresponding element of the excitation surface of the test signal calculated in step 106 as $y_i$, and the length of the analysis segment as N (typically, the length of a segment of the test signal), the analyser 8 calculates a set of cross correlation coefficients $R_i$, where i=0, 1, 2 . . . , by calculating:

$$h_j = \sum_{k=0}^{q-1} x_k y_{j+k}$$

for j = . . . −2, −1, 0, 1, 2, . . .
and
$R_i = h_{i-(n-1)}$
for i = 0, 1, 2 . . .

The two significant parameters are the delay between the test signal and the corresponding echo portion of the distorted signal, and the amplitude of the echo portion of the distorted signal. The amplitude of the echo portion is given by the largest value of cross correlation coefficient ($R_i$max), and the delay is given by the value of i which corresponds to that maximum.

In this embodiment, each of these parameters is fitted (e.g. by linear regression) so that the predicted subjective opinion score $Y_{LE}$ is a function of the error activity, error distribution, error delay and error temporal correlation.

Effects of the Invention

Referring to FIGS. 9a–9e, the representation of various types of telecommunications apparatus' distortion of the test signal of FIG. 8a by the first and second embodiments of the invention will now be illustrated.

Figure 9A:
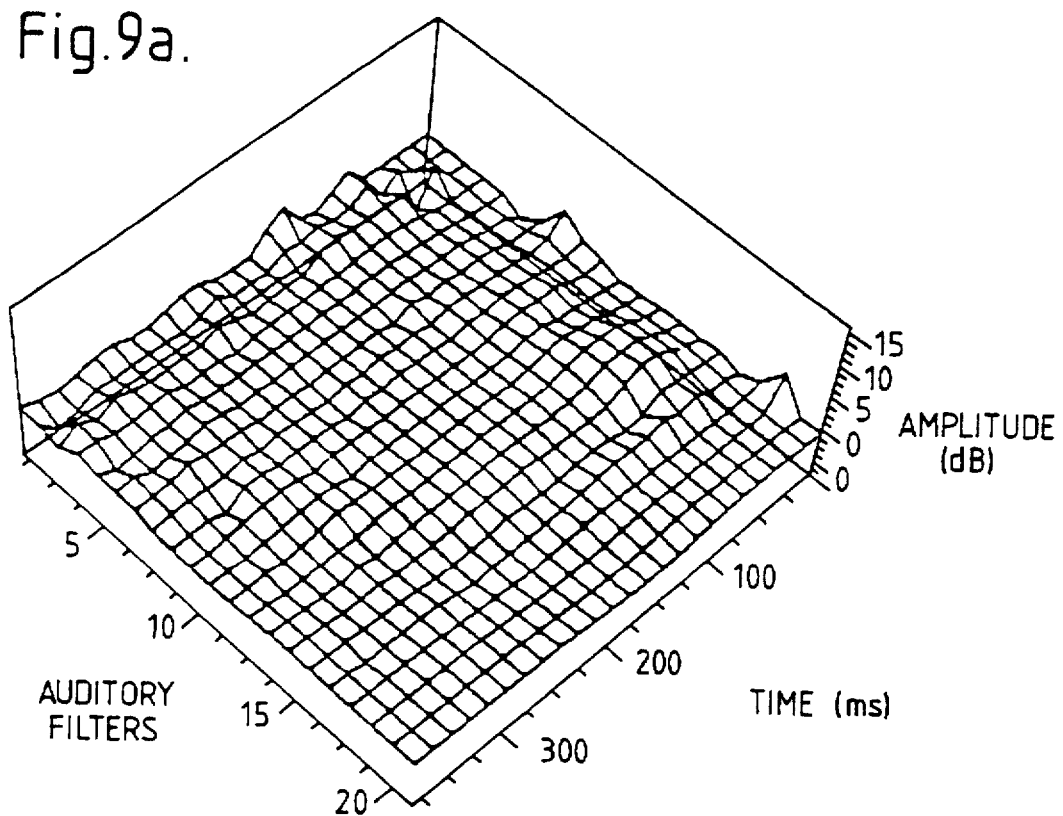
Figure 9B:
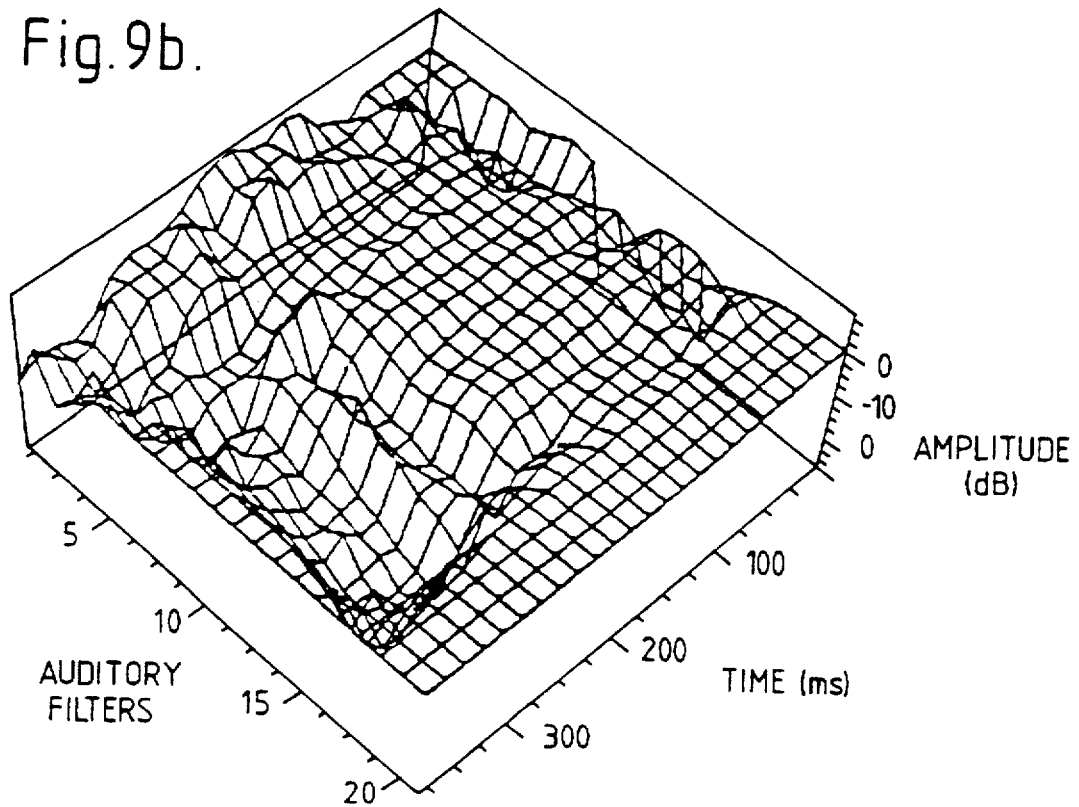
FIG. 9b corresponds to FIG. 9a but with higher amplitude nonlinear distortion.

FIG. 9a shows the error excitation surface produced by instantaneous amplitude distortion produced by adding low amplitude second and third order terms to the signal. The distortion was characterised as "barely audible" by a human listener. FIG. 9b shows the corresponding error amplitude surface for fully audible nonlinear distortion of the same type, but with higher value second and third order terms. The amplitude of the error is much larger. Additionally, it will be seen that the majority of the distortion loudness coincides with the voiced part of the test signal of FIG. 8a, since this contains low frequency formant tones whose harmonics are perceptually significant.

Figure 9C:
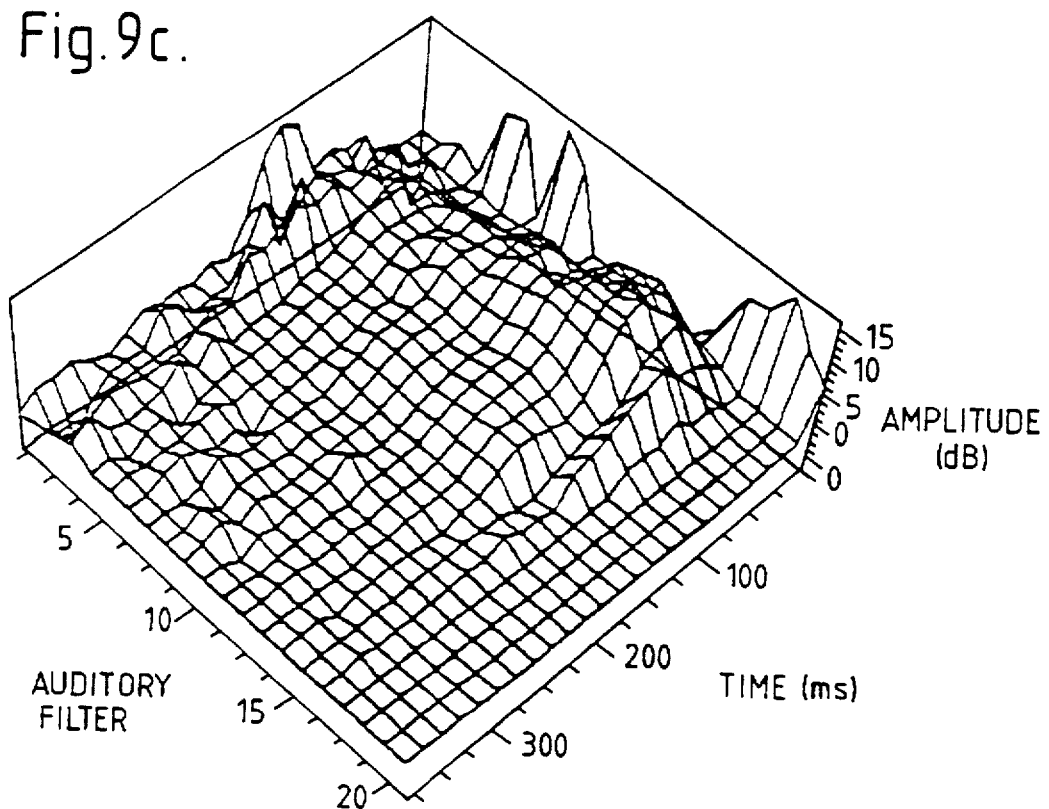
FIG. 9c corresponds to FIG. 9a but with the substitution of MNRU distortion.

Referring to FIG. 9c, the effects of modulated noise reference unit (MNRU) distortion are shown. MNRU distortion is described in Annex A of CCITT Recommendation P81, and is designed to be theoretically equivalent to the distortion introduced by a single A Law PCM stage (of the kind widely used in telecommunications systems). The level of distortion was characterised as fully audible by a human listener. Again, it will be seen from FIG. 9c that the perceptual distortion is associated chiefly with formants in the voiced part of the test signal.

Figure 9D:
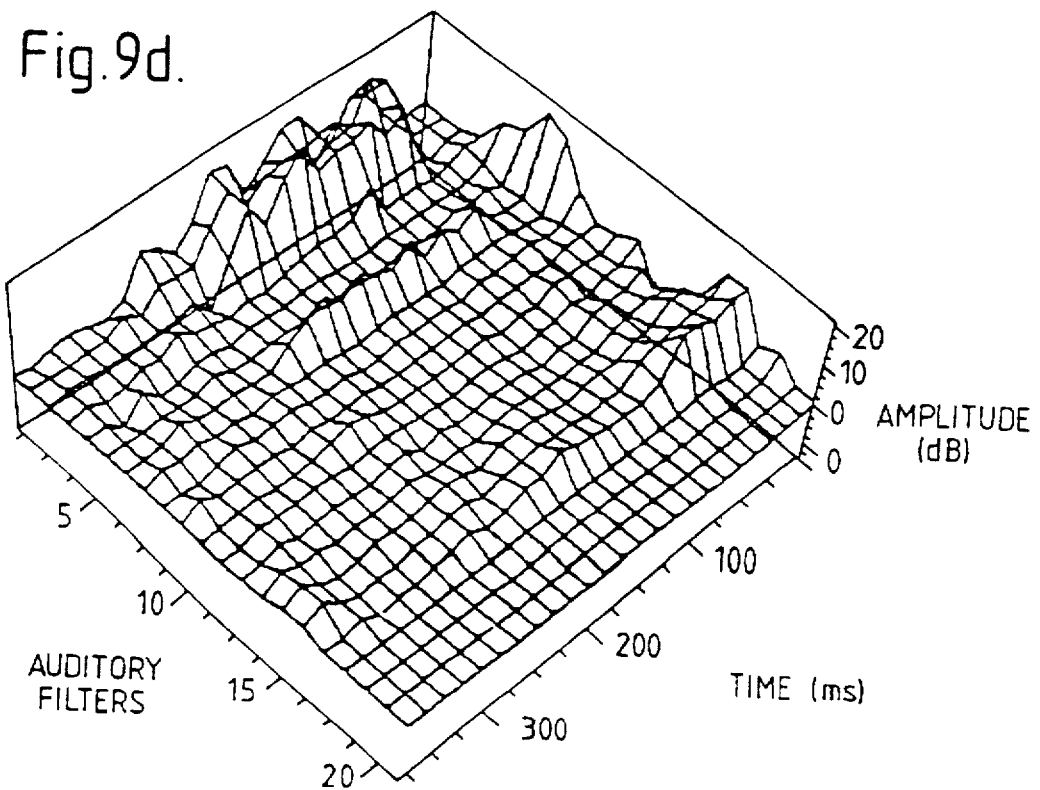
FIG. 9d corresponds to FIG. 9a but with the substitution of crossover distortion.

Referring to FIG. 9d, when crossover distortion is supplied (i.e. distortion of the kind y=mx+c for x greater than zero and y=mx−c for x less than zero) low amplitude signals are not transmitted, and so the lower energy unvoiced sound in the second part of the test signal is drastically attenuated. FIG. 9d therefore suggests a very significant subjective impact of this kind of distortion, which corresponds with the reaction of the human listener.

Figure 9E:
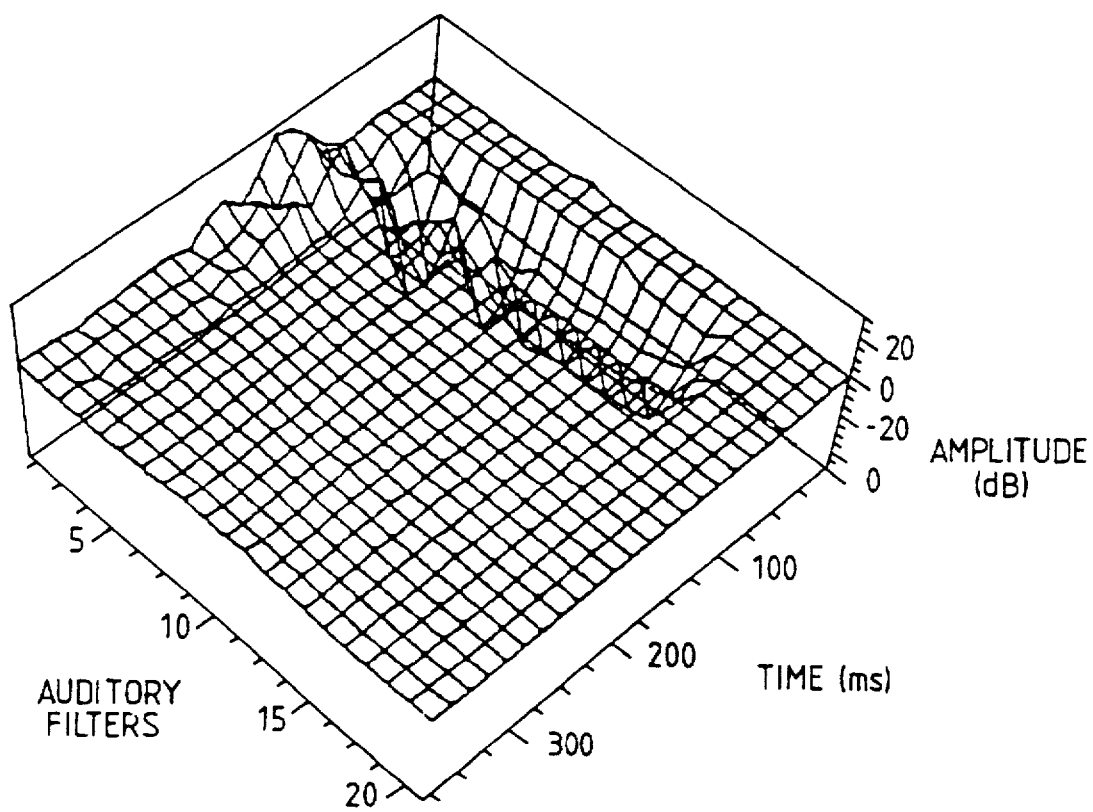
FIG. 9e corresponds to FIG. 9a but with the substitution of clipping distortion due to a voice activity detector.

Finally FIG. 9e illustrates the effects of a voice activity detector with a 50 millisecond onset time. In the initial part of the signal, there is a large (negative) error because the signal has been clipped. The following (positive) error is due to overshoot or settling.

Other Alternatives and Modifications

It will be clear from the foregoing that many variations to the above described embodiments can be made without altering the principle of operation of the invention. For example, if the telecommunications apparatus is arranged to receive a digital input, the DAC 71 may be dispensed with. The signal from the output port 5 could be supplied in digital form to the input port 2 of the telecommunications apparatus and the ADC 81 may likewise be dispensed with. Alternatively, an electromechanical transducer could be provided at the output port 5 and the signal supplied as an audio signal. In the latter case the test signal may be supplied via an artificial mouth as discussed in CCITT P.51 Recommendation on Artificial Ear and Artificial Mouth, Volume 5, Rec P.51, Melbourne 1988 and earlier UK patent application GB2218300 (8730347), both incorporated herewith by reference. Similarly, the distorted speech signal could be received via an artificial ear acoustic structure as described in the above CCITT Recommendation and our earlier UK patent application GB2218299 (8730346) incorporated herein by reference. This would reduce the filtering needed in the step 101.

As well as using the error activity and distribution measures to determine the subjective impact of distortion, as discussed above, in further embodiments the rate of change of these parameters over time during the test signal may be used, since rapidly changing distortion may sound less acceptable to a listener.

Although in the above described embodiments, a single decay profile for temporal masking is described, it may be preferred in alternative embodiments of the invention to provide a plurality (for instance 2) of decay rates for forward (and backward) masking, and to select the required decay rate in dependence upon the duration of the masking sound (i.e. the number of time segments over which the amplitude in one of the passbands exceeds a predetermined level). For example, maximum and minimum decays (corresponding to 200 milliseconds and 5 milliseconds duration respectively, may be defined by:

$$y = 58.4039 \cdot 10^{-0.0059x}$$

$$y = 55.5955 \cdot 10^{-0.0163x}$$

Although connections to an actual telecommunications apparatus have been described herein, it would equally be possible to programme a computing apparatus to simulate the distortions introduced by telecommunications apparatus, since many such distortions are relatively easy to characterise (for example, those due to VADs or codecs). Accordingly, the invention extends likewise to embodiments in which a signal is supplied to such simulation apparatus, and the simulated distorted output of the telecommunications apparatus is processed. In this way, the acceptability to a human listener of the combination of many complicated and nonlinear communications apparatus may be modelled prior to assembling or connecting such apparatus in the field.

Although the analysis unit 8 and test signal generator 7 have been described as separate hardware, in practice they could be realised by a single suitably processed digital processor; likewise, the telecommunications apparatus simulator referred to in the above embodiment could be provided by the same processor.

Although in the above described embodiments the analyzer unit 8 receives and analyses the test signal from the text signal generator 7, in practice the analyzer unit 8 could store the excitation data previously derived for the, or each of several, test sequences by an earlier analysis. Thus, the analyzer unit in such embodiments need not be arranged itself to analyze the undistorted test signal.

Although linear regression has been described as a method of finding the combination process used in the combination step 110, it would equally be possible to use a higher order regression, for example a logistic and double quadratic expansion as follows:

$$\text{Logit}(Y_{LE}) = b_0 + b_1 E_A' + b_2 E_A'^2 +$$
$$b_3 E_A' E_E' + b_4 E_E' + b_5 E_E'^2$$
$$= \ln(Y_{LE}/(4 - Y_{LE}))$$

Then the estimated value of opinion score Y', is given by:

$$Y' = 4/(1 + e^{-w})$$

where $$w = \ln(Y_{LE}/(4 - Y_{LE}))$$

Finding the coefficients $b_i$ is achieved by an iterative weighted least squares calculation; many statistical calculation programmes are available for this purpose, including for example GLIM (™).

In this document, for convenience, the term "phoneme" is used to indicate a single, repeatable, human speech sound, notwithstanding that in its normal usage a "phoneme" may denote a sound which is modified by its speech context.

Unless the reverse is indicated or apparent, the features of the above embodiments may be combined in manners other than those explicitly detailed herein.

Although the embodiments described above relate to testing telecommunications apparatus, the application of novel aspects of the invention to other testing or analysis is not excluded.

I claim:

1. Telecommunications testing apparatus arranged to receive a distorted signal which corresponds to a test signal when distorted by telecommunications apparatus to be tested, the testing apparatus comprising:

means for periodically deriving, from the distorted signal, a plurality of spectral component signals responsive to the distortion in each of a plurality of spectral bands, over a succession of time intervals, means for generating a measure of the subjective impact of the distortion due to the telecommunications apparatus, said measure of subjective impact changing as a function of the distribution of the distortion over time and over said spectral bands, and means for generating a measure of the total amount of said distortion over a predetermined time segment, and to provide a quantitative measure of said subjective impact based on both said measure of distribution of the distortion and said total amount of distortion.

2. Apparatus as in claim 1, in which a measure of distortion distribution $E_E$ is related to the sum over all time intervals (i) and spectral bands (j) of the value: $-a(i,j) \cdot \ln(a(i,j))$, where $a(i,j)$ is the absolute magnitude of distortion in a predetermined time interval (i), and spectral band (j), expressed as a proportion of the total distortion over all time intervals (i) and spectral bands (j).

3. Apparatus as in claim 1, in which the means for generating a measure of the subjective impact of distortion estimates the extent to which the distortion will be perceptible to a human listener.

4. Apparatus as in claim 3 in which the means for generating a measure of the subjective impact of distortion performs spectral and temporal masking calculations.

5. Apparatus as in claim 1, in which the means for generating a measure of the subjective impact of distortion performs a pitch analysis upon said distorted signal, in which said spectral bands comprise pitch bands.

6. Apparatus as in claim 1, further comprising a signal generator for supplying a test signal which has a spectral resemblance to human speech.

7. Apparatus as in claim 6, in which said test signal does not correspond to a single speaker conveying intelligent content speech.

8. Apparatus as in claim 6 in which:

the signal generator generates a test signal which comprises a sequence formed of a predetermined, small, number of speech segments, the speech signal comprising several different portions including said segments such that said segments are represented in several different temporal contexts within said sequence, so as to vary the effects on each segment of time varying distortions in the telecommunications apparatus.

9. Apparatus as in claim 1, in which the means for generating a measure of the subjective impact of distortion analyzes the distorted signal, and forms, for each spectral band over each time interval, a measure of the difference between the distorted signal and the test signal.

10. Telecommunications testing apparatus arranged to receive a distorted signal which corresponds to a test signal when distorted by telecommunications apparatus to be tested, the testing apparatus comprising:

means for periodically deriving, from the distorted signal, a plurality of spectral component signals responsive to the distortion in each of a plurality of spectral bands, over a succession of time intervals, means for generating a measure of the subjective impact of the distortion due to the telecommunications apparatus, said measure of subjective impact changing as a function of the distribution of the distortion over time and over said spectral bands, and means for generating a measure of temporal correlation between distortion and the test signal, and to generate said subjective impact measure in dependence upon said temporal correlation measure.

11. Apparatus as in claim 10 wherein said means for generating a measure of temporal correlation utilizes a temporally displaced version of the test signal.

12. Telecommunications testing apparatus arranged to receive a distorted signal which corresponds to a test signal when distorted by telecommunications apparatus to be tested, the testing apparatus comprising:

means for periodically deriving, from the distorted signal, a plurality of spectral component signals responsive to the distortion in each of a plurality of spectral bands, over a succession of time intervals, means for generating a measure of the subjective impact of the distortion due to the telecommunications apparatus, said measure of subjective impact changing as a function of the distribution of the distortion over time and over said spectral bands, and said time intervals being longer for lower frequency spectral component signals than for higher frequency spectral component signals.

13. A method of analysing the output of a speech signal handling apparatus to derive a measure of the audibility of distortion generated thereby, the method comprising:

providing a predetermined test signal;

analysing the distorted signal corresponding to the test signal when distorted by the apparatus, using a digital electronic distortion calculation apparatus; and generating an indication of the subjective impact of said distortion based on said analysis;

said step of analysing including deriving a distribution measure of the spectral and temporal distribution of said distortion, deriving a total measure of the total amount of distortion, and said distribution measure and said total measure being both used to derive said subjective impact measurement.

14. A method as in claim 13 in which a measure of the extent to which the distortion will be perceptible to a human listener is derived.

15. A method as in claim 14 in which the analysis step comprises spectral and temporal masking calculations.

16. A method as in claim 13 in which a pitch analysis is performed on the distorted signal.

17. A method as in claim 13 in which a signal having a spectral resemblance to human speech is used as a test signal.

18. A method as in claim 17 in which the test signal does not correspond to a single speaker conveying intelligent content speech.

19. A method as in claim 17 in which:

the test signal comprises a sequence formed of a predetermined, small, number of speech segment, and the speech signal comprises several different portions including said segments such that said segments are represented in several different temporal contexts within said sequence, so as to vary the effects on each segment of time varying distortions in the telecommunications apparatus.

20. A method as in claim 13 in which the measure of distortion is determined by analysing the distorted signal, and forming, for each spectral band over each time interval, a measure of the difference between the distorted signal and the test signal.

21. A method of analyzing the output of a speech signal handling apparatus to derive a measure of the audibility of distortion generated thereby the method comprising:

providing a predetermined test signal;

analyzing the distorted signal corresponding to the test signal when distorted by the apparatus using a digital electronic distortion calculation apparatus:

generating an indication of the subjective impact of said distortion based on said analysis;

said step of analyzing including deriving a measure of the spectral and temporal distribution of said distortion, and said distribution measure being used to derive said subjective impact measurement;

measure of distortion $E_E$ being determined as the sum over all time intervals (i), and spectral bands (j), of the value: $-a(i,j) \cdot \ln (a(i,j))$, where $a(i,j)$ is the absolute magnitude of distortion in a predetermined time interval (i), and spectral band (j), expressed as a proportion of the total distortion over all time intervals (i) and spectral bands (j).

22. A method of analyzing the output of a speech signal handling apparatus to derive a measure of the audibility of distortion generated thereby, the method comprising:

providing a predetermined test signal;

analyzing the distorted signal corresponding to the test signal when distorted by the apparatus, using a digital electronic distortion calculation apparatus;

generating an indication of the subjective impact of said distortion based on said analysis;

said step of analyzing including deriving a measure of the spectral and temporal distribution of said distortion and said distribution measure being used to derive said subjective impact measurement; and deriving a measure of the temporal correlation between the distortion and the original signal.

23. A method of analyzing the output of a speech signal handling apparatus to derive a measure of the audibility of distortion generated thereby, the method comprising:

providing a predetermined test signal;

analyzing the distorted signal corresponding to the test signal when distorted by the apparatus, using a digital electronic distortion calculation apparatus;

generating an indication of the subjective impact of said distortion based on said analysis;

said step of analyzing including deriving a measure of the spectral and temporal distribution of said distortion and said distribution measure being used to derive said subjective impact measurement;

deriving a measure of the total amount of distortion over a predetermined period of time, and the input signal being assessed over a plurality of time intervals, said time intervals being longer for lower frequency spectral component signals than for higher frequency spectral component signals.

24. A method for quantitatively measuring distortion in speech handling circuits, said method comprising the steps of:

inputting a test signal into a speech handling circuit;

generating an intermediate quantitative measure of respectively corresponding speech signal distortion in an output of the speech handling circuit as a multi-dimensional function of both time and frequency;

generating a distortion error entropy measurement based on said intermediate multi-dimensional measure, said distortion error entropy measurement also varying as a function of the distribution of measured distortion over time and frequency even when the total aggregate of measured distortion over a time and frequency remains constant.

25. A method as in claim 24 further comprising:

generating an estimate of subjective mean opinion scores for the measured distortion by forming a weighted sum of the distortion error entropy measurement and the total aggregate measured distortion over time and frequency.

26. A method as in claim 24, further comprising the step of deriving a measure of the total amount of distortion over a predetermined period of time.

27. A method as in claim 26 in which a measure of distribution $E_E$ is determined as the sum over all time intervals (i), and spectral bands (j), of the value: $-a(i,j) \cdot \ln (a(i,j))$, where $a(i,j)$ is the absolute magnitude of the distortion in a predetermined time interval (i), and spectral band (j), expressed as a proportion of the total distortion over all time intervals (i) and spectral bands (j).

28. A method as in claim 24 further comprising the step of deriving a measure of the temporal correlation between the distortion and the original signal.

29. A method as in claim 24 in which a measure of the extent to which the distortion will be perceptible to a human listener is derived.

30. A method as in claim 29 in which the analysis step comprises spectral and temporal masking calculations.

31. A method as in claim 24 in which a pitch analysis is performed on the distorted signal.

32. A method as in claim 24 in which a signal having a spectral resemblance to human speech is used as a test signal.

33. A method as in claim 32 in which the test signal does not correspond to a single speaker conveying intelligent content speech.

34. A method as in claim 32 in which:

the test signal comprises a sequence formed of a predetermined, small, number of speech segment, and the speech signal comprises several different portions including said segments such that said segments are represented in several different temporal contexts within said sequence, so as to vary the effects on each segment of time varying distortions in the telecommunications apparatus.

35. A method as in claim 24 in which the measure of distortion is determined by analyzing the distorted signal, and forming, for each spectral band over each time interval, a measure of the difference between the distorted signal and the test signal.

36. A method as in claim 24 in which the input signal is assessed over a plurality of time intervals, said time intervals being longer for lower frequency spectral component signals than for higher frequency spectral component signals.

37. Apparatus for quantitatively distortion measuring in speech handling circuits, said apparatus comprising:

means for inputting a test signal into a speech handling circuit;

means for generating an intermediate quantitative measure of respectively corresponding speech signal distortion in an output of the speech handling circuit as a multi-dimensional function of both time and frequency;

means for generating a distortion error entropy based on said intermediate multi-dimensional measure, said distortion error entropy measurement also varying as a function of the distribution of measured distortion over time and frequency even when the total aggregate of measured distortion over a time and frequency remains constant.

38. Apparatus as in claim 37 further comprising:

means for generating an estimate of subjective mean opinion scores for the measured distortion by forming a weighted sum of the distortion error entropy measurement and the total aggregate measured distortion over time and frequency.

39. Apparatus as in claim 37 further comprising means for generating a measure of the total amount of said distortion over a predetermined time segment, and to provide a quantitative measure of said subjective impact based on both said measure of distribution of the distortion and said total amount of distortion.

40. Apparatus as in claim 39 in which a measure of distortion distribution $E_E$ is related to the sum over all time intervals (i) and spectral bands (j) of the value: $-a(i,j) \cdot \ln(a(i,j))$, where $a(i,j)$ is the absolute magnitude of distortion in a predetermined time interval (i), and spectral band (j), expressed as a proportion of the total distortion over all time intervals (i) and spectral bands (j).

41. Apparatus as in claim 37 further comprising means for generating a measure of temporal correlation between distortion and the test signal, and to generate said subjective impact measure in dependence upon said temporal correlation measure.

42. Apparatus as in claim 41 wherein said means for generating a measure of temporal correlation utilizes a temporally displaced version of the test signal.

43. Apparatus as in claim 37, in which the means for generating a measure of the subjective impact of distortion estimates the extent to which the distortion will be perceptible to a human listener.

44. Apparatus as in claim 43 in which the means for generating a measure of the subjective impact of distortion performs spectral and temporal masking calculations.

45. Apparatus as in claim 37 in which the means for generating a measure of the subjective impact of distortion performs a pitch analysis upon said distorted signal, in which said spectral bands comprise pitch bands.

46. Apparatus as in claim 37 further comprising a signal generator for supplying a test signal which has a spectral resemblance to human speech.

47. Apparatus as in claim 46, in which said test signal does not correspond to a single speaker conveying intelligent content speech.

48. Apparatus as in claim 46 in which:

the signal generator generates a test signal which comprises a sequence formed of a predetermined, small, number of speech segments.

the speech signal comprising several different portions including said segments such that said segments are presented in several different temporal contexts within said sequence, so as to vary the effects on each segment of time varying distortions in the telecommunications apparatus.

49. Apparatus as in claim 37 in which the means for generating a measure of the subjective impact of distortion analyzes the distorted signal, and forms, for each spectral band over each time interval, a measure of the difference between the distorted signal and the test signal.

50. Apparatus as in claim 37 in which the said time intervals are longer for lower frequency spectral component signals than for higher frequency spectral component signals.

* * * * *

UNITED STATES PATENT AND TRADEMARK OFFICE
CERTIFICATE OF CORRECTION

PATENT NO. : 5,794,188
DATED : Aug. 11, 1998
INVENTOR(S) : Hollier

It is certified that error appears in the above-indentified patent and that said Letters Patent is hereby corrected as shown below:

On cover page;

Add: --RELATED U.S. APPLICATION DATA

[63] Continuation-in-part of 08/351,421 filed December 12, 1994, now Patent No. 5,621,854 issued April 15, 1997, and continuation-in-part of 08/564,069 filed December 14, 1995, now Patent No. 5,890,104 issued March 30 1999."

Column 1, line 6, insert the following:

--RELATED APPLICATIONS

This is a continuation-in-part of my earlier applications Ser. No. 08/351,421, filed Dec. 12, 1994 (now U.S. Pat. No. 5,621,854 issued Apr. 15, 1997) and Ser. 08/564,069, filed Dec. 14, 1995 (now U.S. Pat. No. 5,890,104 issued Mar. 30, 1999). This application is also related to other applications 08/671,931, filed Jun. 27, 1996 (now U.S. Pat. No. 5,799,133 issued Aug. 25, 1998) and PCT/GB96/01821.--.

Column 2, line 17, after "now" add: --U.S. Patent No. 5,621,854 issued Apr. 15, 1997 from--

Signed and Sealed this

Third Day of April, 2001

Attest:

NICHOLAS P. GODICI

Attesting Officer    Acting Director of the United States Patent and Trademark Office